US012581808B2

(12) United States Patent
Bang et al.

(10) Patent No.: US 12,581,808 B2
(45) Date of Patent: Mar. 17, 2026

(54) ELECTROLUMINESCENT DISPLAY DEVICE

(71) Applicant: LG DISPLAY CO., LTD., Seoul (KR)

(72) Inventors: Seungho Bang, Goyang-si (KR); Jonghan Park, Seoul (KR); Hyeona Kim, Incheon (KR); Bokyoung Lee, Seoul (KR); JungHo Bang, Paju-si (KR)

(73) Assignee: LG Display Co., Ltd (KR)

( * ) Notice: Subject to any disclaimer, the term of this patent is extended or adjusted under 35 U.S.C. 154(b) by 703 days.

(21) Appl. No.: 17/880,971

(22) Filed: Aug. 4, 2022

(65) Prior Publication Data

US 2023/0071206 A1 Mar. 9, 2023

(30) Foreign Application Priority Data

| Sep. 3, 2021 | (KR) | 10-2021-0117577 |
| Sep. 3, 2021 | (KR) | 10-2021-0117630 |
| Dec. 20, 2021 | (KR) | 10-2021-0182893 |

(51) Int. Cl.
*H10K 59/124* (2023.01)
*H10K 50/844* (2023.01)
(Continued)

(52) U.S. Cl.
CPC ......... *H10K 59/124* (2023.02); *H10K 50/844* (2023.02); *H10K 71/00* (2023.02); *H10K 59/1201* (2023.02)

(58) Field of Classification Search
CPC ..................... H10K 59/124; H10K 59/8723
See application file for complete search history.

(56) References Cited

U.S. PATENT DOCUMENTS

| 11,329,255 | B2 * | 5/2022 | Lim | ..................... H10K 59/122 |
| 2009/0273589 | A1 * | 11/2009 | Asano | ................ H10K 50/8426 |
| | | | | 345/80 |

(Continued)

FOREIGN PATENT DOCUMENTS

| KR | 20200067576 A | 6/2020 |
| KR | 20200073544 A | 6/2020 |

OTHER PUBLICATIONS

Office Action in Korean Appln. No. 10-2021-0182893, mailed on Jun. 24, 2025, 13 pages (with English translation).

*Primary Examiner* — Vincent Wall
(74) *Attorney, Agent, or Firm* — Fish & Richardson P.C.

(57) ABSTRACT

An electroluminescent display device includes a substrate having a display area surrounding a through-hole, and a non-display area disposed between the display area and the through-hole, a thin-film transistor disposed on an upper portion of the display area and a light-emitting element connected to the thin-film transistor, a plurality of insulating layers disposed between the substrate and the thin-film transistor, a planarization layer disposed between the thin-film transistor and the light-emitting element, and at least one anti-connection part disposed in the non-display area and including the plurality of insulating layers and the planarization layer, in which the planarization layer and the plurality of insulating layers, which constitute the anti-connection part, and each of the planarization layer and the plurality of insulating layers has an undercut shape in which a bottom surface is narrower than a top surface, so that the light-emitting part of the light-emitting element is disconnected in the through-hole by the anti-connection part, thereby penetration of moisture through the light-emitting part may be inhibited.

26 Claims, 33 Drawing Sheets

(51) Int. Cl.
    H10K 59/12       (2023.01)
    H10K 71/00       (2023.01)

(56)          References Cited

U.S. PATENT DOCUMENTS

| | | | |
|---|---|---|---|
| 2015/0014636 A1* | 1/2015 | Kang | H10K 59/122 |
| | | | 438/26 |
| 2015/0091030 A1* | 4/2015 | Lee | H10K 50/8445 |
| | | | 438/34 |
| 2015/0200237 A1* | 7/2015 | Yim | H10K 50/8428 |
| | | | 257/40 |
| 2016/0013438 A1* | 1/2016 | Im | H10K 59/80522 |
| | | | 257/762 |
| 2016/0300894 A1* | 10/2016 | Park | H10K 59/124 |
| 2018/0033998 A1* | 2/2018 | Kim | H10K 59/12 |
| 2018/0138450 A1* | 5/2018 | Park | H10K 59/40 |
| 2018/0151838 A1* | 5/2018 | Park | H10K 59/131 |
| 2018/0190935 A1* | 7/2018 | Kim | H10K 59/122 |
| 2019/0140037 A1* | 5/2019 | Lee | H10K 59/131 |
| 2019/0229164 A1* | 7/2019 | Kim | H10K 59/131 |
| 2020/0027933 A1* | 1/2020 | Heo | H10K 59/8723 |
| 2020/0258958 A1* | 8/2020 | Gai | H10K 59/38 |
| 2020/0287157 A1* | 9/2020 | Seong | H10K 59/122 |
| 2021/0066418 A1* | 3/2021 | Seo | H10K 71/231 |
| 2022/0085125 A1* | 3/2022 | Yun | H10K 59/124 |
| 2023/0071206 A1* | 3/2023 | Bang | H10K 50/844 |

* cited by examiner

ELECTROLUMINESCENT DISPLAY DEVICE

CROSS-REFERENCE TO RELATED APPLICATION

This application claims the priority of Korean Patent Applications No. 10-2021-0117577 filed on Sep. 3, 2021, No. 10-2021-0117630 filed on Sep. 3, 2021 and No. 10-2021-0182893 filed on Dec. 20, 2021, which are hereby incorporated by reference in their entirety.

BACKGROUND

Field of the Disclosure

The present disclosure relates to an electroluminescent display device, and more particularly, to an electroluminescent display device including a substrate hole that penetrates a substrate.

Description of the Background

Recently, a display field for visually expressing electrical information signals has been rapidly developed as the information age has come in earnest. Therefore, various display devices, which are thin in thickness and light in weight and have a desirable performance such as low power consumption, have been developed.

In general, an electronic device such as a monitor, a TV set, a notebook computer, or a digital camera includes a display device that implements images. For example, the display device may include light-emitting elements. The light-emitting elements may each emit light having a particular color. For example, the light-emitting elements may each include a light-emitting layer positioned between a first electrode and a second electrode.

The display device may be equipped with peripheral devices such as a camera, a speaker, and a sensor. For example, the display device may include a through-hole that penetrates an element substrate that supports the light-emitting elements. The through-hole may be positioned between the light-emitting elements. The peripheral devices may be inserted into the through-hole.

SUMMARY

The present disclosure is to provide an electroluminescent display device, in which a light-emitting part is more assuredly disconnected in a through-hole.

The present disclosure is also to provide an electroluminescent display device capable of inhibiting the penetration of moisture from the outside through a through-hole, thereby damage to a light-emitting element may be inhibited.

The present disclosure is not limited to the above-mentioned and other features, which are not mentioned above, can be clearly understood by those skilled in the art from the following descriptions.

To achieve these and other advantages and in accordance with the present disclosure, as embodied and broadly described, an electroluminescent display device includes a substrate comprises a display area configured to surround a through-hole, and a non-display area disposed between the display area and the through-hole, a thin-film transistor disposed on an upper portion of a substrate in the display area and a light-emitting element connected to the thin-film transistor, a plurality of insulating layers disposed between the substrate and the thin-film transistor, a planarization layer disposed between the thin-film transistor and the light-emitting element and at least one anti-connection part disposed in the non-display area and comprises the plurality of insulating layers and the planarization layer, in which the planarization layer and the plurality of insulating layers, which constitute the anti-connection part, each have an undercut shape in which a bottom surface thereof is narrower than a top surface thereof.

Other detailed matters of the exemplary aspects are included in the detailed description and the drawings.

The present disclosure may provide the electroluminescent display device having a narrow bezel because the through-hole area configured to accommodate the camera is disposed inside the display area of the display panel.

According to the present disclosure, the plurality of anti-connection parts is provided at the periphery of the through-hole area, thereby penetration of moisture and oxygen introduced from the through-hole may be inhibited.

According to the present disclosure, the light-emitting part of the light-emitting element disposed on the entire surface of the display panel, i.e., the light-emitting stack, is disconnected by the anti-connection part, thereby a movement route of moisture and oxygen may be blocked.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
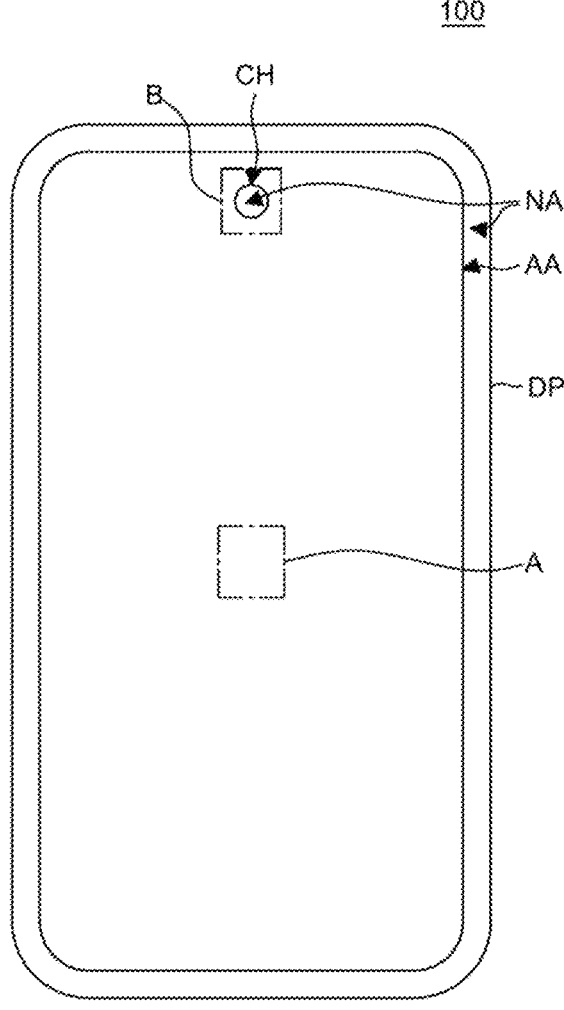
FIG. 1 is a top plan view of an electroluminescent display device according to a first aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, various exemplary aspects of the present disclosure will be described in detail with reference to the accompanying drawings.

FIG. 1 is a top plan view of an electroluminescent display device according to a first aspect of the present disclosure.

Referring to FIG. 1, the electroluminescent display device 100 according to a first aspect of the present disclosure may include a display panel DP.

The display panel DP is a panel configured to display images to a user. The display panel may include a display element configured to display images, a driving element configured to operate the display element, and lines configured to transmit various types of signals to the display element and the driving element. Different display elements may be defined depending on the types of display panels. For example, in a case in which the display panel is an electroluminescent display panel, the display element may be a light-emitting element including an anode, a light-emitting part, and a cathode.

Hereinafter, the assumption is made that the display panel DP is the electroluminescent display panel. However, the display panel is not limited to the electroluminescent display panel.

Referring to FIG. 1, the display panel DP may include a through-hole CH embedded with a camera and a sensor, a display area AA configured to surround the through-hole CH, and a non-display area NA configured to surround the display area AA. The non-display area NA may also be disposed between the display area AA and the through-hole CH.

In the case in which the through-hole CH is disposed in the display area AA, a bezel region, which is the non-display area NA surrounding the display area AA, may be reduced, and the display area AA may be maximized. As described above, a design product with the maximized display area AA maximizes a degree of screen immersion of the user, thereby an aesthetic appearance may be improved.

As illustrated in FIG. 1, the through-hole CH may be provided as a single hole. However, the present disclosure is not limited thereto, and the through-hole CH may be variously disposed.

Hereinafter, subpixels disposed in the display area AA will be described with reference to FIG. 2.

Figure 2:
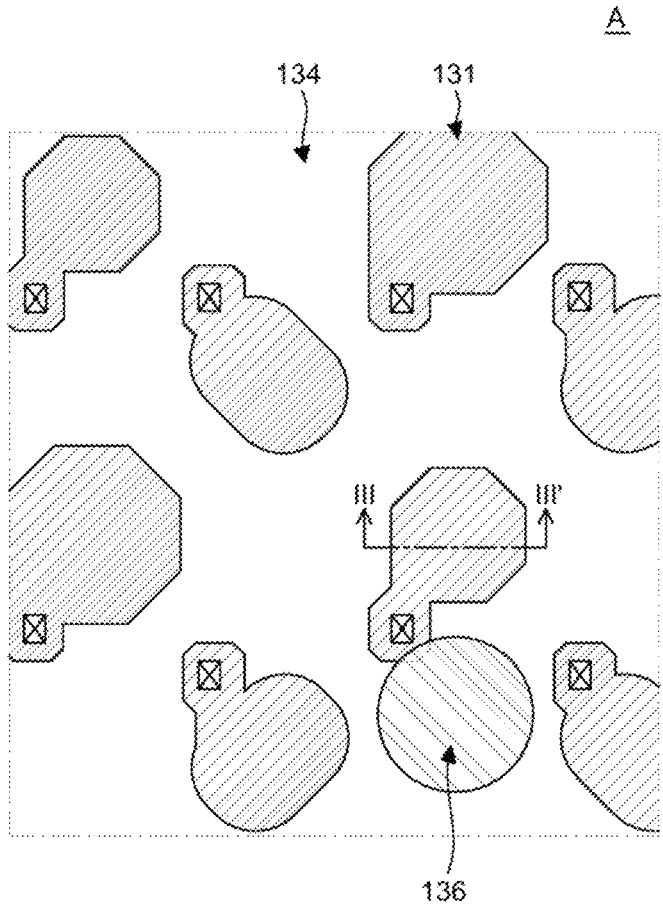
FIG. 2 is an enlarged top plan view of part A in FIG. 1.

FIG. 2 is an enlarged top plan view of part A in FIG. 1.

FIG. 2 illustrates a planar shape of each of the subpixels disposed in the display area AA.

Referring to FIG. 2, a plurality of anodes 131 may be disposed in the display area AA. A bank 134 may be provided between the anodes 131.

The bank 134 may be disposed to cover an edge portion of the anode 131. Only a middle region of the anode 131 adjoins the light-emitting part 132 and thus serves to define a light-emitting region of the subpixel.

A spacer 136 may be disposed in a part of the region in which the bank 134 is disposed. The spacer 136 may be disposed to have a predetermined density in the entire display panel DP. The spacer 136 may serve to support a deposition mask configured to cover or expose the light-emitting part 132 for each of the subpixels at the time of performing a deposition process to form the light-emitting part 132. The spacer 136 may serve to support the mask so that the mask does not come into direct contact with the display panel DP. FIG. 2 illustrates a pentile type flat structure in which the subpixels are disposed in a dot shape.

However, the present disclosure is not limited thereto, and a real type flat structure may be applied.

Hereinafter, a cross-sectional structure of the display area AA of the electroluminescent display device 100 will be described in more detail with reference to FIG. 3.

Figure 3:
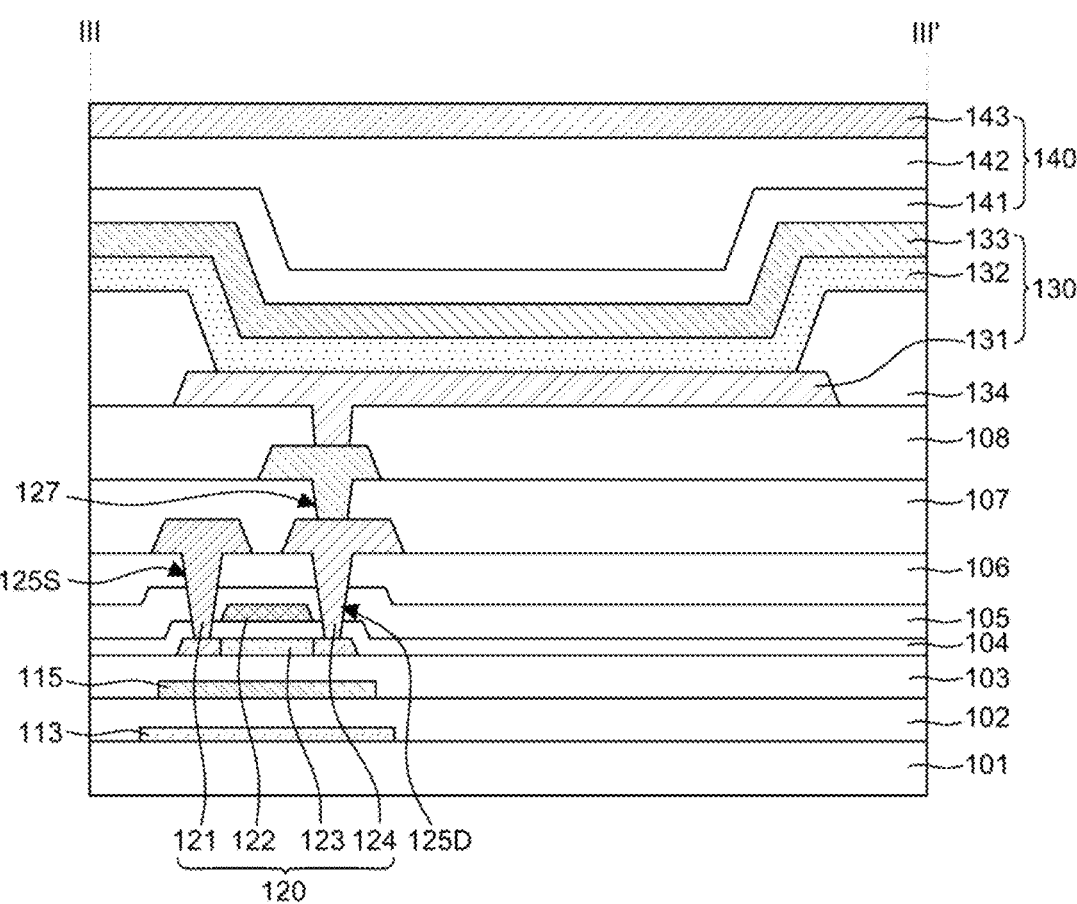
FIG. 3 is a cross-sectional view taken along line in FIG. 2.

FIG. 3 is a cross-sectional view taken along line in FIG. 2.

Specifically, FIG. 3 illustrates the single subpixel in the display area AA of the electroluminescent display device 100 according to the first aspect of the present disclosure.

Referring to FIG. 3, a substrate 101 may support various constituent elements provided on the electroluminescent display device 100. The substrate 101 may be made of a transparent insulating material. For example, the substrate 101 may be made of an insulating material such as glass or plastic.

A first buffer layer 102 and a second buffer layer 103 may be disposed on the substrate 101. A thin-film transistor 120 may be disposed on an upper portion of the second buffer layer 103.

The thin-film transistor 120 may include a semiconductor layer 123, a gate electrode 122, a source electrode 121, and a drain electrode 124.

The first buffer layer 102 may delays diffusion of moisture or oxygen having penetrated into the substrate 101. The first buffer layer 102 may be made by alternately stacking silicon nitride (SiNx) and silicon oxide (SiOx) once or more times.

The second buffer layer 103 may serve to protect the semiconductor layer 123 and suppress various types of defects introduced from the substrate 101. The second buffer layer 103 may be made of amorphous silicon (a-Si), silicon nitride (SiNx), silicon oxide (SiOx), or the like.

The semiconductor layer 123 may be disposed on the second buffer layer 103. The semiconductor layer 123 may be made of, but not limited to, an oxide semiconductor. It is possible to ensure excellent characteristics of the display panel DP by using an oxide thin-film transistor having high mobility and low leakage current (off-current) properties.

The oxide semiconductor is excellent in mobility and uniformity properties. The oxide semiconductor may be made of materials based on indium-tin-gallium-zinc oxide (InSnGaZnO) which is quaternary metal oxide, materials based on indium-gallium-zinc oxide (InGaZnO), indium-tin-zinc oxide (InSnZnO), indium-aluminum-zinc oxide (In-AlZnO), tin-gallium-zinc oxide (SnGaZnO), aluminum-gallium-zinc oxide (AlGaZnO), and tin-aluminum-zinc oxide (SnAlZnO) which are ternary metal oxide, materials based on indium-zinc oxide (InZnO), tin-zinc oxide (SnZnO), aluminum-zinc oxide (AlZnO), zinc-magnesium oxide (ZnMgO), tin-magnesium oxide (SnMgO), and indium-magnesium oxide (InMgO) which are binary metal oxide, materials based on indium oxide (InO), tin oxide (SnO), indium-gallium oxide (InGaO), and zinc oxide (ZnO). The present disclosure is not limited to a composition ratio of the respective elements.

A gate insulating layer 104 may be disposed on the second buffer layer 103 and the semiconductor layer 123. The gate insulating layer 104 may be made of silicon oxide (SiOx), silicon nitride (SiNx), or a multilayer thereof.

The gate electrode 122 may be disposed on the gate insulating layer 104. The gate electrode 122 may be provided on the gate insulating layer 104 and disposed to overlap the semiconductor layer 123. In this case, the gate electrode 122 may be made of, but not limited to, various electrically conductive materials, for example, magnesium (Mg), aluminum (Al), nickel (Ni), chromium (Cr), molybdenum (Mo), tungsten (W), gold (Au), or an alloy thereof.

Meanwhile, a first light-blocking layer 113 may be provided on an upper portion of the substrate 101 and disposed to overlap the semiconductor layer 123. A second light-blocking layer 115 may be provided on an upper portion of the first buffer layer 102 and disposed to overlap the first light-blocking layer 113. The first light-blocking layer 113 and the second light-blocking layer 115 may be made of a metallic material having a light blocking function in order to inhibit outside light from entering the semiconductor layer 123. For example, the first light-blocking layer 113 and the second light-blocking layer 115 may each be configured as a single layer or multilayer made of any one of opaque metallic materials such as aluminum (Al), chromium (Cr), tungsten (W), titanium (Ti), nickel (Ni), neodymium (Nd), molybdenum (Mo), copper (Cu), and an alloy thereof. FIG. 3 illustrates that two light-blocking layers 113 and 115, but the present disclosure is not limited thereto. It is possible to dispose only one of the first light-blocking layer 113 and the second light-blocking layer 115. The light-blocking layer 113 and 115 may be omitted.

Meanwhile, the first light-blocking layer 113 and the second light-blocking layer 115 may constitute a capacitor with the first buffer layer 102 interposed therebetween. Therefore, it is possible to adjust a storage capacitor of the pixel.

A first interlayer insulating layer 105 and a second interlayer insulating layer 106 may be sequentially disposed on an upper portion of the gate insulating layer 104 and an upper portion of the gate electrode 122. The first interlayer insulating layer 105 and the second interlayer insulating layer 106 may each be made of silicon oxide (SiOx), silicon nitride (SiNx), or a multilayer thereof.

The source electrode 121 and the drain electrode 124 may be disposed on the second interlayer insulating layer 106. The source electrode 121 and the drain electrode 124 may be respectively electrically connected to the semiconductor layer 123 through a source contact hole 125S and a drain contact hole 125D formed in the gate insulating layer 104, the first interlayer insulating layer 105, and the second interlayer insulating layer 106. In this case, the source electrode 121 and the drain electrode 124 may each be made of, but not limited to, various electrically conductive materials, for example, magnesium (Mg), aluminum (Al), nickel (Ni), chromium (Cr), molybdenum (Mo), tungsten (W), gold (Au), or an alloy thereof.

A lower planarization layer 107 may be disposed above the thin-film transistor 120. The lower planarization layer 107 may protect the thin-film transistor 120 and flatten an upper portion of the thin-film transistor 120. For example, the lower planarization layer 107 may be made of, but not limited to, an organic insulating film such as benzocyclobutene (BCB) or acrylic.

In this case, a contact hole may be formed in the lower planarization layer 107, and the source electrode 121 or the drain electrode 124 of the thin-film transistor 120 may be exposed through the contact hole.

A connection electrode 127 may be disposed in a region of the contact hole through which the drain electrode 124 is exposed. For example, the connection electrode 127 may be made of titanium (Ti), aluminum (Al), copper (Cu), molybdenum (Mo), aluminum-neodymium (AlNd), molybdenum-titanium (MoTi), and chromium (Cr), an alloy thereof, or a material made by stacking these materials.

An upper planarization layer 108 may be disposed on the connection electrode 127.

The upper planarization layer 108 may have a contact hole through which the connection electrode 127 is exposed.

The light-emitting element 130 connected to the thin-film transistor 120 may be disposed in the contact hole.

The light-emitting element 130 may include the anode 131 electrically connected to the drain electrode 124 of the thin-film transistor 120, and the light-emitting part 132 disposed on the anode 131, and the cathode 133 disposed on the light-emitting part 132. The anode 131 may be referred to as a first electrode, and the cathode 133 may be referred to as a second electrode.

For example, the light-emitting part 132 may include a hole injection layer, a hole transport layer, a light-emitting layer, an electron transport layer, an electron injection layer.

Meanwhile, in a tandem structure in which the plurality of light-emitting layers overlaps one another, a charge generating layer may be additionally disposed between the light-emitting layers. The light-emitting layers may emit light beams with different colors for the respective subpixels. For example, a red light-emitting layer, a green light-emitting layer, and a blue light-emitting layer may be separately formed for each of the subpixels. Alternatively, a common light-emitting layer may be formed to emit white light without distinguishing colors for each of the subpixels, and color filters for distinguishing colors may be separately provided. The light-emitting part 132 may be provided as an approximately common layer and equally disposed for each of the subpixels, except that the individual light-emitting layers are formed.

The anode 131 may be connected to the connection electrode 127 exposed through the contact hole that penetrates the upper planarization layer 108. The anode 131 may have a multilayer structure including a transparent conductive film and an opaque conductive film having high reflection efficiency. The transparent conductive film may be made of a material such as indium-tin-oxide (ITO) or indium-zinc-oxide (IZO) having a comparatively large work function value. The opaque conductive film configured as a single layer or multilayer including aluminum (Al), silver (Ag), copper (Cu), lead (Pb), molybdenum (Mo), titanium (Ti), palladium (Pd), or an alloy thereof. For example, the anode 131 may have a structure made by sequentially stacking the transparent conductive film, the opaque conductive film, and the transparent conductive film. Alternatively, the anode 131 may have a structure made by sequentially stacking the transparent conductive film and the opaque conductive film. The anode 131 may be disposed in the light-emitting region implemented by the bank 134.

The light-emitting part 132 may be made by stacking the hole transport layer, the organic light-emitting layer, and the electron transport layer on the anode 131 in this order or the reverse order. In addition, the light-emitting part 132 may further include a charge generating layer or further include first and second light-emitting parts that face each other with the light-emitting part 132 interposed therebetween.

The bank 134 may be formed to expose the anode 131. The bank 134 may be made of an organic material such as photo acrylic or made of a semi-transparent material. However, the present disclosure is not limited thereto, and the bank 134 may be made of an opaque material to suppress optical interference between the subpixels.

In this case, the cathode 133 may be formed on a top surface of the light-emitting part 132 so as to face the anode 131 with the light-emitting part 132 interposed therebetween. In a case in which the cathode 133 is applied to a top-emission organic light-emitting display device, the cathode 133 may be configured as a thin transparent conductive film made of indium-tin-oxide (ITO), indium-zinc-oxide (IZO) or magnesium-silver (Mg—Ag).

A sealing part 140 may be disposed on the cathode 133 and protect the light-emitting element 130. Because of the nature of the organic material of the light-emitting part 132, dark-spot or pixel shrinkage may occur as the light-emitting element 130 reacts with moisture or oxygen from the outside. To suppress the dark-spot or pixel shrinkage, the sealing part 140 may be disposed on an upper portion of the light-emitting element 130.

The sealing part 140 may include a first inorganic insulating layer 141, an organic insulating layer 142, and a second inorganic insulating layer 143. For example, the first inorganic insulating layer 141 and the second inorganic insulating layer 143 may each be made of an inorganic insulating material such as silicon nitride (SiNx), silicon oxide (SiOx), oxidation silicon nitride (SiON), or aluminum oxide ($Al_2O_3$). The organic insulating layer 142 may be configured as an organic insulating layer. The second inorganic insulating layer 143 may cover top and side surfaces of each of the first inorganic insulating layer 141 and the organic insulating layer 142. The second inorganic insulating layer 143 may minimize or suppress the penetration of moisture or oxygen from the outside into the first inorganic insulating layer 141 and the organic insulating layer 142. In this case, the first inorganic insulating layer 141 and the second inorganic insulating layer 143 may serve to suppress the penetration of moisture or oxygen. The organic insulating layer 142 may serve to flatten an upper portion of the first inorganic insulating layer 141. However, the present disclosure is not limited to the configuration of the sealing part 140.

Hereinafter, a cross-sectional structure of a through-hole area CHA in which the through-hole CH of the electroluminescent display device 100 is disposed will be described in more detail with reference to FIG. 4.

Figure 4:
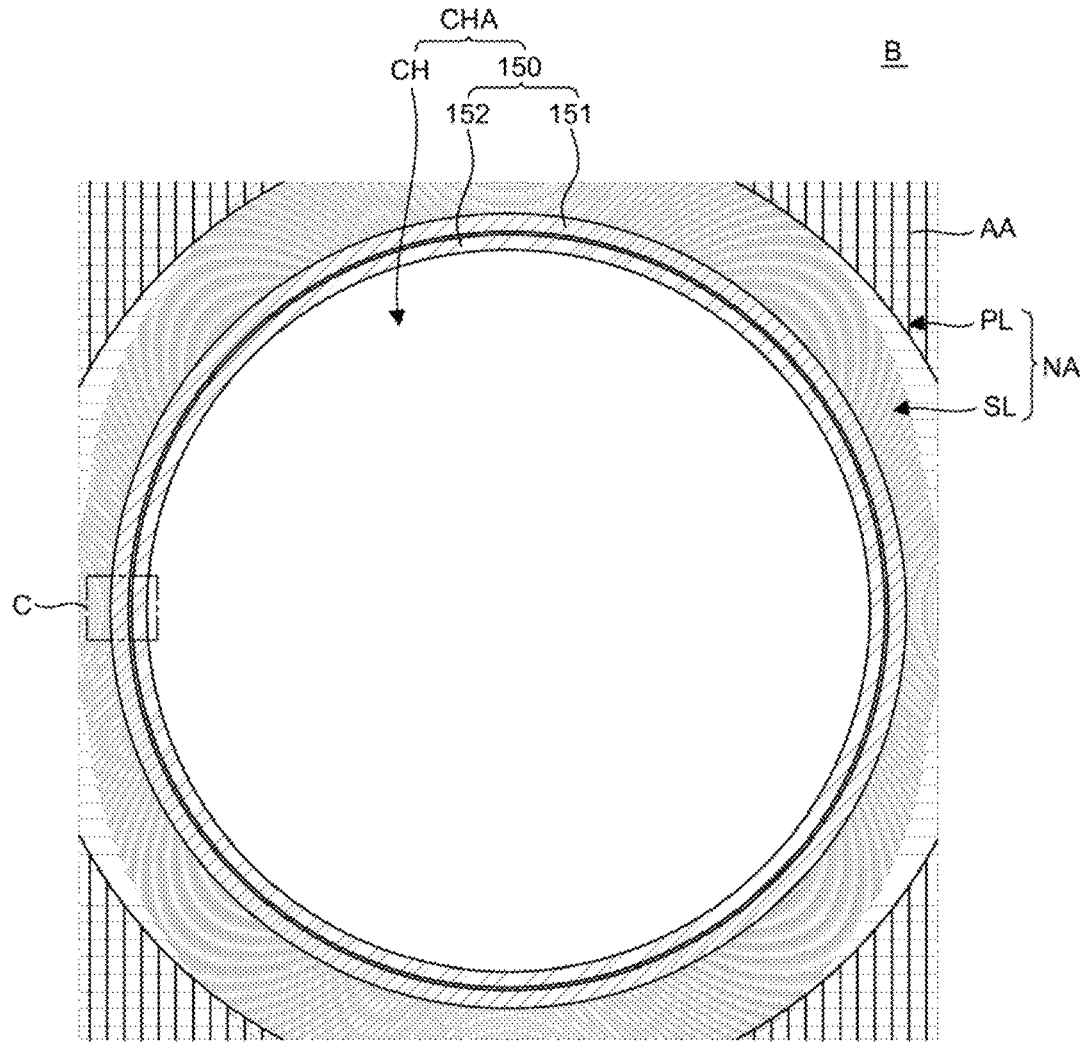
FIG. 4 is an enlarged top plan view of part B in FIG. 1.

FIG. 4 is an enlarged top plan view of part B in FIG. 1.

FIG. 4 is an enlarged view of part B in which the through-hole CH in FIG. 1 is disposed.

Referring to FIG. 4, the through-hole area CHA may include the display area AA configured to surround the through-hole CH, and the non-display area NA disposed between the display area AA and the through-hole CH. The through-hole CH having a large circular space may be provided at a center of the through-hole area CHA, and a camera module may be disposed in the through-hole CH. Constituent elements disposed in the through-hole CH may be removed by a laser. Therefore, a part of the substrate 101 may be removed, except for a part of the region of the through-hole CH.

The non-display area NA may be disposed between the through-hole area CHA and the display area AA. An anti-connection part 150 may be disposed in the non-display area NA and provided at the periphery of the region of the through-hole CH. In this case, the anti-connection part 150 may include a first anti-connection part 151 provided between the through-hole CH and the display area AA and disposed adjacent to the display area AA, and a second anti-connection part 152 provided between the through-hole CH and the display area AA and disposed adjacent to the through-hole CH.

In addition, the second anti-connection part 152 and the first anti-connection part 151 may be sequentially disposed based on a center of the through-hole area CH. The first anti-connection part 151 and the second anti-connection part 152 may be disposed to protect the light-emitting element 130 in the display area AA from moisture or oxygen that may be introduced from the through-hole area CHA. The light-emitting part 132 of the light-emitting element 130 may be deposited on an entire surface of the display panel DP. The light-emitting part 132 may also be uniformly deposited in the through-hole area CHA. Because of the nature of the organic material, the light-emitting part 132 has high reactivity and dispersity in respect to moisture and oxygen, such that moisture and oxygen may be transmitted to the light-emitting element 130 in the display area AA. To suppress this problem, the first anti-connection part 151 and the second anti-connection part 152 may allow the light-emitting part 132 to be partially disconnected. The first anti-connection part 151 and the second anti-connection part 152 will be described below in more detail with reference to FIGS. 6A and 6B. In the present specification, the configuration has been described in which the two anti-connection parts 151 and 152 are used. However, the present disclosure is not limited to the number of anti-connection parts 151 and 152.

In addition to the first anti-connection part 151 and the second anti-connection part 152, various lines may be disposed in the non-display area NA around the through-hole area CHA.

The light-emitting element 130 and a pixel circuit in the corresponding region are removed to dispose the through-hole area CHA. However, the light-emitting element 130 and the pixel circuit disposed at upper, lower, left, and right sides based on the through-hole area CHA need to be electrically connected. To this end, a high-potential power line PL, a gate line SL, and the like may be disposed in the non-display area NA adjacent to the through-hole area CHA so as to be connected at the upper, lower, left, and right sides while bypassing the through-hole area CHA.

Figure 5:
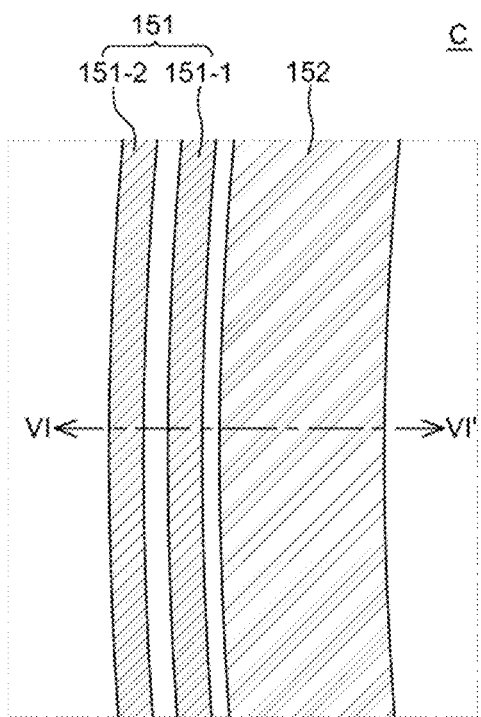
FIG. 5 is an enlarged top plan view of part C in FIG. 4.

FIG. 5 is an enlarged top plan view of part C in FIG. 4.

Referring to FIG. 5, the second anti-connection part 152 and the first anti-connection part 151 may be sequentially disposed based on the through-hole CH. The second anti-connection part 152 is provided between the through-hole CH and the display area AA and disposed adjacent to the through-hole CH. The first anti-connection part 151 is provided between the through-hole CH and the display area AA and disposed adjacent to the display area AA. Referring to FIGS. 4 and 5, the second anti-connection part 152 and the first anti-connection part 151 may be disposed in a closed-loop shape based on the through-hole CH. When any one of the first anti-connection part 151 and the second anti-connection part 152 is penetrated, i.e., opened, moisture and oxygen may penetrate into the display area AA from the outside, or the organic insulating layer 142 inside the through-hole area CHA may flow over the through-hole area CHA.

Referring to FIG. 5, the first anti-connection part 151 may include two anti-connection structures including a first anti-connection structure 151-1 and a second anti-connection structure 151-2. However, the present disclosure is not limited thereto. For example, three or more anti-connection structures may be provided. In addition to the first anti-connection part 151, an anti-connection structure may be further disposed at a right portion of the second anti-connection part 152, i.e., a portion adjacent to the through-hole CH.

Hereinafter, a cross-sectional structure of the through-hole area CHA in which the through-hole CH of the electroluminescent display device 100 is disposed will be described in more detail with reference to FIGS. 6A and 6B.

Figure 6A:
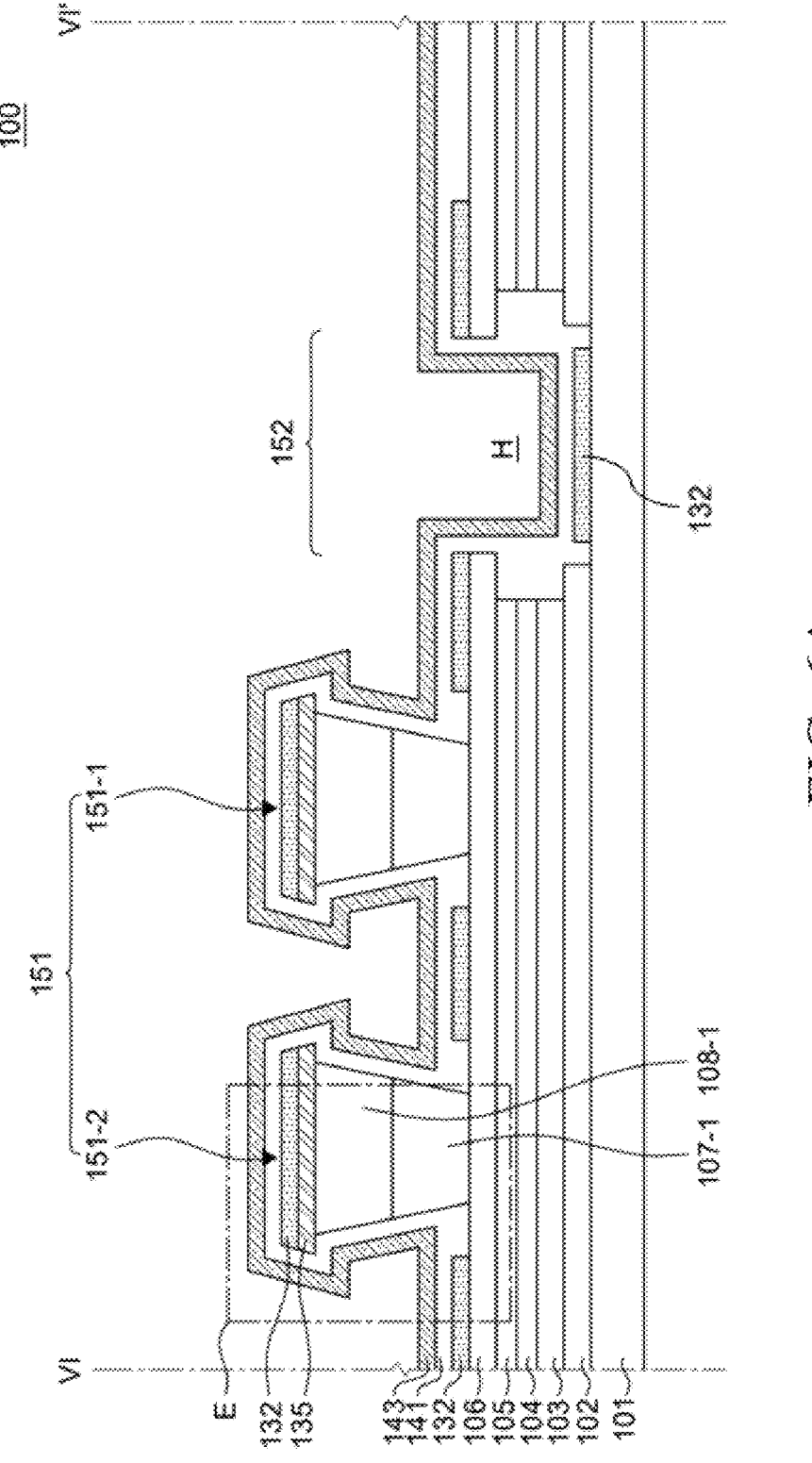
FIG. 6A is a cross-sectional view taken along line VI-VI' in FIG. 5.

FIG. 6A is a cross-sectional view taken along line VI-VI' in FIG. 5.

Figure 6B:
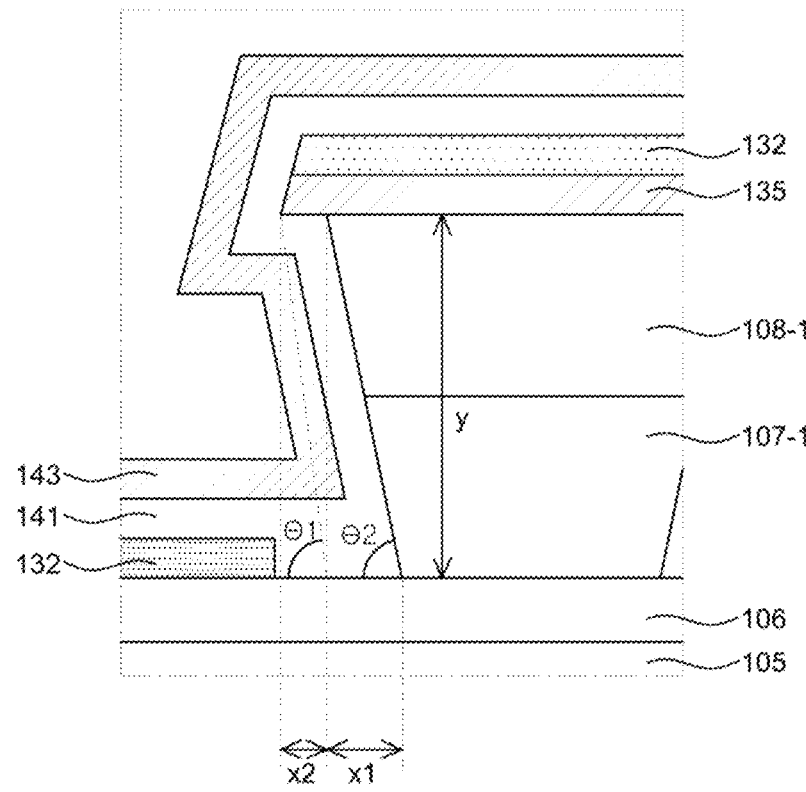
FIG. 6B is an enlarged cross-sectional view of part E in FIG. 6A.

FIG. 6B is an enlarged cross-sectional view of part E in FIG. 6A.

The cross-sectional structure of the through-hole area CHA of the electroluminescent display device 100 according to the first aspect of the present disclosure will be described with reference to FIGS. 6A and 6B. Various insulating films, which are present on the substrate 101 and in the display area AA, may be disposed in the through-hole area CHA. For example, the first buffer layer 102, the second buffer layer 103, the gate insulating layer 104, the first interlayer insulating layer 105, and the second interlayer insulating layer 106 may be disposed by being sequentially stacked on the upper portion of the substrate 101.

The through-hole area CHA may vary depending on the size of the camera to be applied to the product. Some insulating films or line structures may be disposed in the through-hole area CHA. However, at the time of patterning the through-hole area CHA with laser beams, the laser beams may be emitted in a circular or elliptical shape depending on the shape of the through-hole area CHA. All the constituent elements on the upper portion of the substrate 101 and the substrate 101 may be removed by the emitted laser beams. A pattern may be easily formed on a desired portion or a particular site may be easily removed by using the laser.

The anti-connection part 150 including the first anti-connection part 151 and the second anti-connection part 152 may be provided in the through-hole area CHA. The anti-connection part 150 may disconnect the light-emitting part 132 of the light-emitting element 130 in the through-hole area CHA. That is, if the light-emitting part 132 of the light-emitting element 130 is exposed to the outside, a route of penetration of moisture, through which moisture penetrates into the electroluminescent display device 100, may be formed. Therefore, the anti-connection part 150 capable of disconnecting the light-emitting part 132 is required so that the light-emitting part 132 is not exposed to the outside.

In general, because the through-hole area CHA has a very thin bezel margin, the through-hole area CHA in the display area AA is more vulnerable to the penetration of moisture than the outer periphery of the electroluminescent display device 100. Therefore, the present disclosure is characterized by having the anti-connection part 150 including the first anti-connection part 151 and the second anti-connection part 152.

The first anti-connection part 151 may include a first planarization layer 107-1, a second planarization layer 108-1 disposed on the first planarization layer 107-1, an etching-blocking layer 135 disposed on the second planarization layer 108-1, and the light-emitting part 132 of the light-emitting element 130 disposed on the etching-blocking layer 135. In this case, the first planarization layer 107-1 may be disposed on the same layer and made of the same material as the lower planarization layer 107 in the display area AA. The second planarization layer 108-1 may be disposed on the same layer and made of the same material as the upper planarization layer 108 in the display area AA. The etching-blocking layer 135 may be disposed on the same layer and made of the same material as the first electrode, i.e., the anode 131 of the light-emitting element 130.

The first anti-connection part 151 may have an undercut shape in which a bottom surface of the first planarization layer 107-1 is narrower than a top surface of the etching-blocking layer 135. When the etching-blocking layer 135 is removed so that the bottom surface of the first planarization layer 107-1 is recessed inward from the top surface of the etching-blocking layer 135, the layer, i.e., the light-emitting part 132 deposited on the upper portion of the first anti-connection part 151 cannot cover the entire side surface of the first anti-connection part 151 but is disconnected as illustrated in FIGS. 6A and 6B. Therefore, the light-emitting part 132 of the light-emitting element 130 may be disconnected on the first anti-connection part 151. If a general hole is formed, the light-emitting part 132 may be connected without being disconnected. Therefore, the undercut structure is formed so that the light-emitting part 132 may be assuredly disconnected.

Meanwhile, the light-emitting part 132 may be deposited at a deposition angle of 25° to 90°. That is, the light-emitting part 132 is deposited at a deposition angle of substantially 90° at the center of the display panel DP at which the mask is disposed. In contrast, the light-emitting part 132 may be deposited even at a deposition angle of 25° at an edge of the display panel DP. Therefore, a minimum deposition angle θ1 may be set to 25°.

However, to completely separate the light-emitting part 132 of the light-emitting element 130 from the first anti-connection part 151, a distance Δx to which the bottom surface of the first planarization layer 107-1 is recessed inward at the end of the etching-blocking layer 135 may be more important than the minimum deposition angle θ1 of 25°. In this case, Δx may be a sum of a distance x2 to which the top surface of the second planarization layer 108-1 is recessed inward at the end of the etching-blocking layer 135 and a distance x1 to which the bottom surface of the first planarization layer 107-1 is recessed inward at the upper end of the second planarization layer 108-1.

In this case, the minimum incident angle for depositing the light-emitting part 132 is set to 25°. However, the present disclosure is not limited thereto, and the minimum incident angle may vary depending on the thickness and pattern shape of the mask used to form the light-emitting part 132. In addition, the angle θ1 may have a minimum value of 25° as a lower angle of the etching-blocking layer 135 according to a minimum incident angle of a source used for deposition.

For example, it can be seen that when Δx is 3 μm, 4 μm, 5 μm, and 6 μm in a state in which a sum y of heights of the first and second planarization layers 107-1 and 108-1 is fixed to 2 μm, an angle θ2 between a line segment from the end of the etching-blocking layer 135 to the lower end of the first planarization layer 107-1 and the second interlayer insulating layer 106 disposed at the lower end of the first anti-connection part 151 is 33°, 26°, 21°, and 18°. A condition of Δx≥2.1y for making θ2 less than 25° may be obtained from the result.

That is, particularly, in the case of the first anti-connection part 151, when the distance Δx to which the bottom surface of the first planarization layer 107-1 is recessed inward at the end of the etching-blocking layer 135 satisfies Expression 1 below, the angle θ2 between the line segment from the end of the etching-blocking layer 135 to the lower end of the first planarization layer 107-1 and the second interlayer insulating layer 106 disposed at the lower end of the first anti-connection part 151 becomes less than 25°, and the light-emitting part 132 of the light-emitting element 130 may be completely separated from the first anti-connection part 151.

$$\Delta x \geq 2.1y \qquad \text{[Expression 1]}$$

Here, in Expression 1, Δx represents a distance to which the bottom surface of the first planarization layer 107-1 is recessed inward at the end of the etching-blocking layer 135, and y represents a sum of the heights of the first and second planarization layers 107-1 and 108-1.

Because y may be changed in accordance with required specifications, y may be fixed to 0.5 μm in this case.

In this case, since tan θ1 is y/x2, a minimum value of Δx(x1+x2) may be determined by y.

That is, since the minimum incident angle is 25°, θ1 may be fixed to 25°, and a minimum Δx value may be obtained on the basis of a y value.

Even though the distance x2 may vary depending on various process conditions such as dry etching, the distance x2 to which the top surface of the second planarization layer 108-1 is recessed inward at the end of the etching-blocking layer 135 increases in accordance with an etching time t from a basic x value produced at 30 seconds according to the simulation result in a case in which the undercut shape is formed by performing etching for 30 seconds, for example. Therefore, the distance x2 may be expressed as the following equation.

$$x2\ (\mu m)=0.75+0.07t$$

Likewise, a distance x1 to which the bottom surface of the first planarization layer 107-1 is recessed inward at the upper end of the second planarization layer 108-1 increases in accordance with the etching time t from the basic x value produced at 30 seconds. However, in this case, the increasing speed is lower than the formation of x2, and this may be expressed as the following equation.

$$X1\ (\mu m)=0.47+0.03t$$

Therefore, the undercut structure, which satisfies Expression 1, may be formed by adjusting the etching time t.

Therefore, the dry etching process may adjust the value of x1+x2, such that a final angle of the undercut structure may be larger than 25°.

Meanwhile, the second anti-connection part 152 in the through-hole area CHA may have an undercut shape in which the bottom surface is narrower than the top surface of each of the plurality of insulating layers disposed in the through-hole area CHA. For example, the second anti-connection part 152 may include at least one anti-connection hole H, a first inorganic insulating film disposed around the anti-connection hole H, second inorganic insulating films disposed on the first inorganic insulating film and made of different materials, and a third inorganic insulating film disposed on the second inorganic insulating film. In this case, the first inorganic insulating film may be the first buffer layer 102. The second inorganic insulating film may be a layer including at least one of the second buffer layer 103, the gate insulating layer 104, and the first interlayer insulating layer 105. The third inorganic insulating film may be the second interlayer insulating layer 106. For reference, hereinafter, the same reference numerals are used for the convenience of description.

The anti-connection hole H may be disposed between the first anti-connection part 151 and the through-hole CH. The first inorganic insulating film (e.g., first buffer layer 102), the second inorganic insulating films (e.g., including at least one of the second buffer layer 103, the gate insulating layer 104, and the first interlayer insulating layer 105), and the third inorganic insulating film (e.g., second interlayer insulating layer 106) may be partially removed by the anti-connection hole H. For example, the anti-connection hole H may be formed to penetrate at least one of the first inorganic insulating film, the second inorganic insulating films, and the third inorganic insulating film.

The first inorganic insulating film (first buffer layer 102), the second inorganic insulating films (second buffer layer 103, gate insulating layer 104, and first interlayer insulating layer 105), and the third inorganic insulating film (second interlayer insulating layer 106) may be configured such that inorganic insulating films made of different materials are alternately stacked. In this case, the second anti-connection part 152 may have a structure in which the second inorganic insulating films (second buffer layer103, gate insulating layer 104, and first interlayer insulating layer 105) made of different materials from the first inorganic insulating film (first buffer layer 102) and the third inorganic insulating film (second interlayer insulating layer 106) are disposed between the first inorganic insulating film and the third inorganic insulating film. For example, when the first inorganic insulating film (first buffer layer 102) and the third inorganic insulating film (second interlayer insulating layer 106) are made of silicon nitride (SiNx), the second inorganic insulating films (second buffer layer 103, gate insulating layer 104, and first interlayer insulating layer 105) may be made of silicon oxide (SiOx). The second inorganic insulating films made of different materials from the first inorganic insulating film and the third insulating film also have different etching rates from the first inorganic insulating film and the third inorganic insulating film. Therefore, when the anti-connection hole H is formed to penetrate the plurality of insulating films disposed in the through-hole area CHA by dry etching or the like, the ends of the first inorganic insulating film, the second inorganic insulating films, and the third inorganic insulating film exposed through the anti-connection hole H may be different from one another because of the difference in etching rates between the first inorganic insulating film, the second inorganic insulating films, and the third inorganic insulating film. For example, the side surfaces of the first inorganic insulating film (first buffer layer 102) and the third inorganic insulating film (second interlayer insulating layer 106) may further protrude than the side surfaces of the second inorganic insulating films (second buffer layer 103, gate insulating layer 104, and first interlayer insulating layer 105).

At the time of depositing the light-emitting part 132, the light-emitting part 132 is disconnected by the anti-connection hole H that penetrates the first inorganic insulating film, the second inorganic insulating films, and the third inorganic insulating film. Therefore, the light-emitting part 132 of the light-emitting element 130 may be disconnected on the second anti-connection part 152.

The anti-connection hole H exposes the surface of the substrate 101. The light-emitting part 132 of the light-emitting element 130 may be disposed on the exposed surface of the substrate 101 so as to be disconnected from the periphery thereof.

In addition, even if a crack is formed in any one of the first inorganic insulating film, the second inorganic insulating films, and the third inorganic insulating film at the time of forming the through-hole CH by using the laser, the anti-connection hole H formed in the first inorganic insulating film (first buffer layer 102), the second inorganic insulating films (second buffer layer 103, gate insulating layer 104, and first interlayer insulating layer 105), and the third inorganic insulating film (second interlayer insulating layer 106) may inhibit the crack from being spread in a direction of the display area AA.

Meanwhile, the first inorganic insulating layer 141 and the second inorganic insulating layer 143, which constitute the sealing part 140, may be disposed in the region in which the first anti-connection part 151 and the second anti-connection part 152 are disposed. However, the organic insulating layer 142 constituting the sealing part 140 may not be disposed on the first anti-connection part 151 and the second anti-connection part 152. Specifically, the first anti-connection part 151 may be provided between the through-hole area CHA and the display area AA and disposed in the region adjacent to the display area AA, thereby inhibiting the organic insulating layer 142 from flowing over the first anti-connection part 151. That is, the organic insulating layer 142 may generally be formed by applying the organic insulating layer 142 made of a liquid material onto the entire surface of the display panel DP. In this case, the first anti-connection part 151 disposed adjacent to the display area AA may resist against the spread of the organic insulating layer 142 and serve to inhibit the overflow of the organic insulating layer 142. Therefore, the organic insulating layer 142 may not be disposed on the first anti-connection part 151 and the second anti-connection part 152. Therefore, since the first anti-connection part 151 of the electroluminescent display device 100 according to the first aspect of the present disclosure inhibits the overflow of the organic insulating layer 142, a dam for inhibiting the overflow of the organic insulating layer 142 in the non-display area NA may be omitted. Therefore, it is possible to further reduce the bezel size and increase the opening portion region (i.e., light-emitting region).

The first inorganic insulating layer 141 and the second inorganic insulating layer 143 of the sealing part 140 may cover the region in which the light-emitting part 132 is separated from the first anti-connection part 151 and the second anti-connection part 152, thereby the penetration route of moisture and oxygen that propagate through the light-emitting part 132 in the through-hole CH region may be blocked.

Hereinafter, a process of manufacturing the first anti-connection part 151 disposed in the through-hole area CHA will be described in more detail with reference to FIGS. 7A to 7E.

FIGS. 7A to 7E are cross-sectional views sequentially illustrating a part of a process of manufacturing the first anti-connection part illustrated in FIGS. 6A and 6B.

Figure 8A:
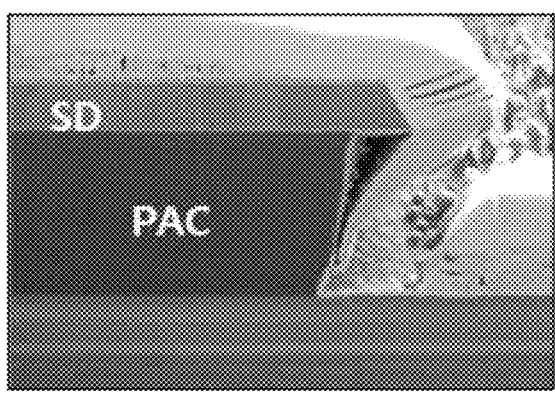
FIGS. 8A and 8B are scanning electron microscope (SEM) images illustrating etched states of the first anti-connection part in FIGS. 6A and 6B with respect to etching time.
Figure 8B:
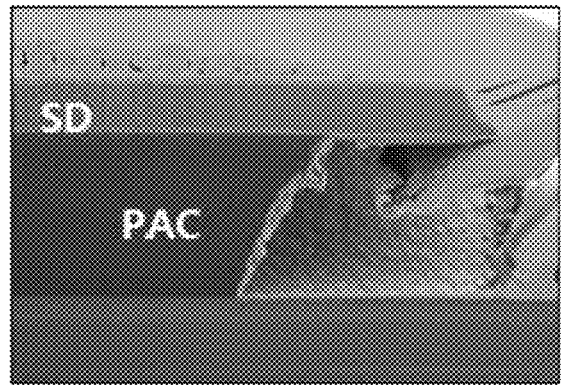

FIGS. 8A and 8B are scanning electron microscope (SEM) images illustrating etched states of the first anti-connection part in FIGS. 6A and 6B with respect to etching time.

FIGS. 8A and 8B are scanning electron microscope images illustrating a change in angle defined between the line segment from the end of the etching-blocking layer 135 to the lower end of the first planarization layer 107-1 and the second interlayer insulating layer 106 disposed at the lower end of the first anti-connection part 151 with respect to the etching time at the time of manufacturing the first anti-connection part 151 illustrated in FIGS. 6A and 6B.

FIGS. 7A to 7E illustrate only the second anti-connection structure 151-2 adjacent to the display area of the first anti-connection part 151 for the convenience of description. However, the first anti-connection structure 151-1 may also be formed in addition to the second anti-connection structure 151-2.

Figure 7A:
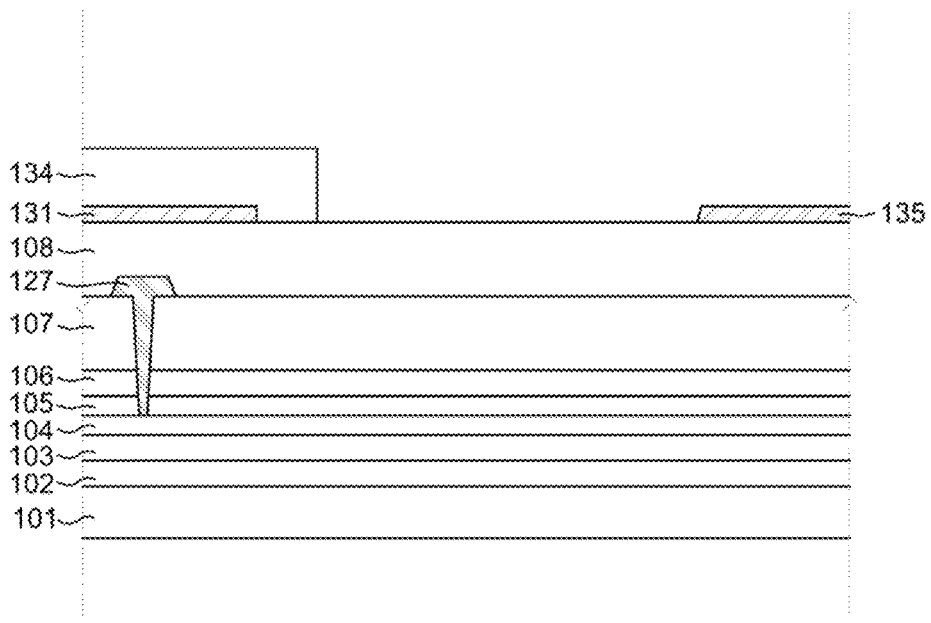
FIGS. 7A to 7E are cross-sectional views sequentially illustrating a part of a process of manufacturing a first anti-connection part illustrated in FIGS. 6A and 6B.

Referring to FIG. 7A, the first buffer layer 102, the second buffer layer 103, the gate insulating layer 104, the first interlayer insulating layer 105, the second interlayer insulating layer 106, the lower planarization layer 107, the connection electrode 127, and the upper planarization layer 108 may be formed on the substrate 101.

Next, the anode 131 may be formed on the upper portion of the upper planarization layer 108 and disposed in the region corresponding to the display area AA. The etching-blocking layer 135 may be formed in the region corresponding to the through-hole area CHA and made of the same material as the anode 131. Thereafter, the bank 134 may be formed on the anode 131 disposed in the region corresponding to the display area AA and cover the anode 131.

Figure 7B:
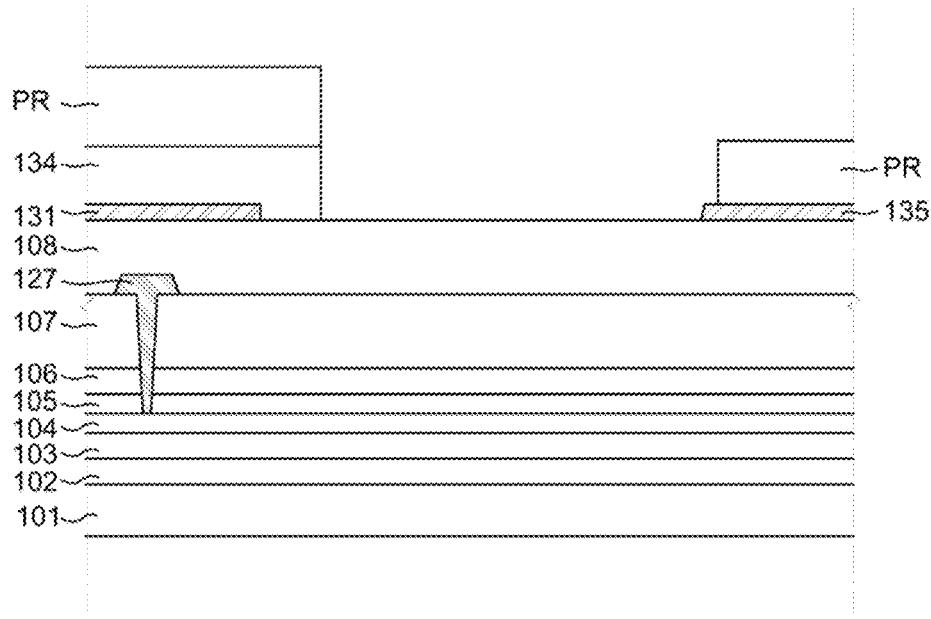

Referring to FIG. 7B, a photoresist PR may be applied in the region corresponding to the bank 134 and the etching-blocking layer 135.

Figure 7C:
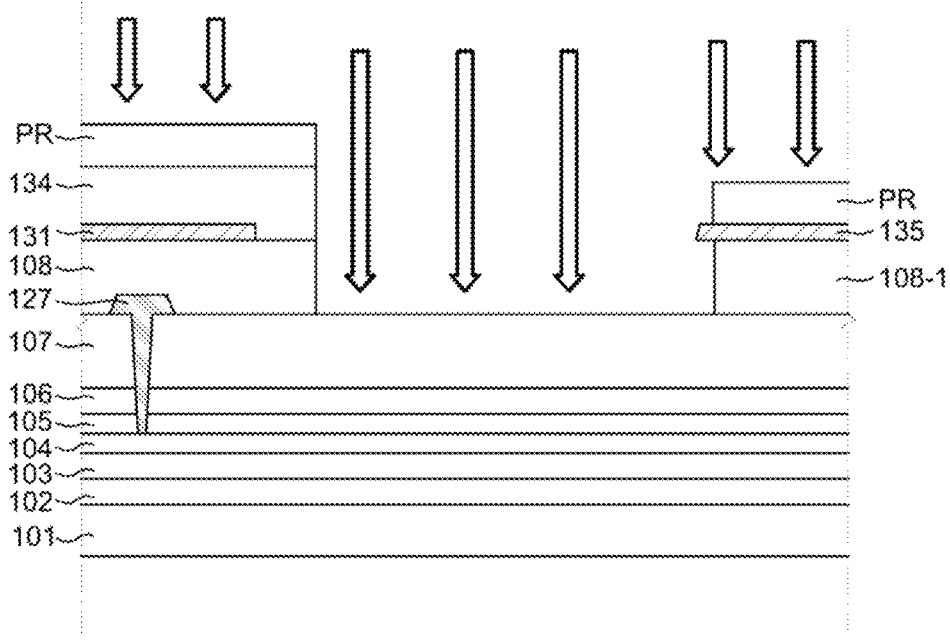

Referring to FIG. 7C, a primary dry etching process is performed by using the photoresist PR as a mask and thus removes a part of the upper planarization layer 108, such that the second planarization layer 108-1 may be formed at the lower end of the etching-blocking layer 135.

In this case, only a part of the photoresist PR is merely removed. The photoresist PR may remain on the etching-blocking layer 135 without being completely removed.

Figure 7D:
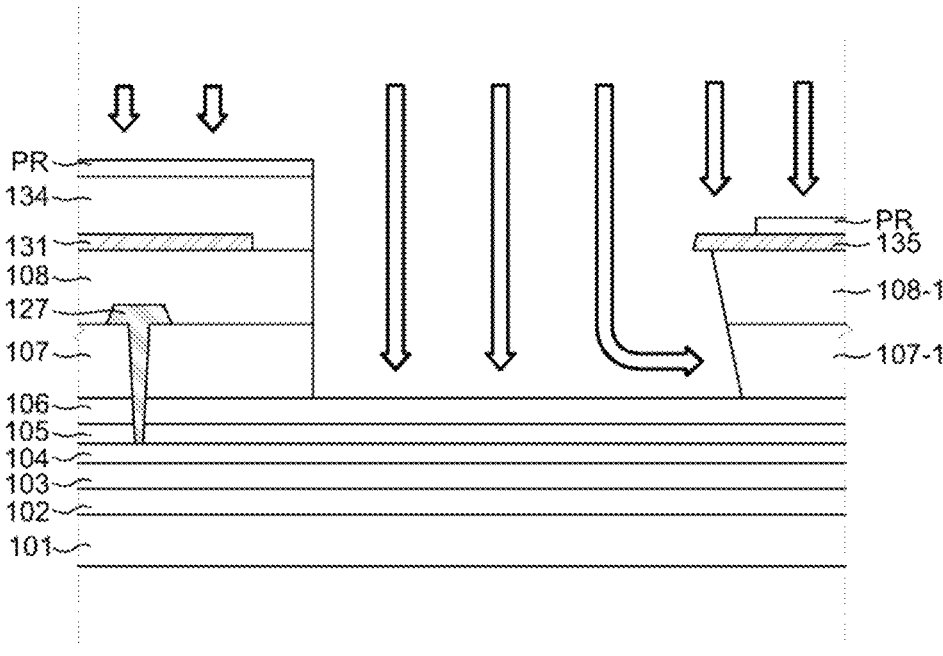

Next, referring to FIG. 7D, a secondary dry etching process may be performed by using the photoresist PR, as a mask, remaining after the primary dry etching.

Therefore, a part of the lower planarization layer 107 may be removed, such that the first planarization layer 107-1 may be formed on the lower portion of the second planarization layer 108-1.

In this case, in the secondary dry etching process, an angle at which the first anti-connection part 151 is etched may vary depending on the etching time.

The etching time of the secondary dry etching process may be adjusted so that the angle defined between the line segment from the end of the etching-blocking layer 135 to the lower end of the first planarization layer 107-1 and the second interlayer insulating layer 106 disposed at the lower end of the first anti-connection part 151 becomes less than 25°. For example, FIG. 8A illustrates a scanning electron microscope (SEM) image of the cross-section of the first anti-connection part 151 when the secondary dry etching process is performed for 30 seconds. FIG. 8B illustrates a scanning electron microscope (SEM) image of the cross-section of the first anti-connection part 151 when the secondary dry etching process is performed for 50 seconds. Referring to FIGS. 8A and 8B, the angle defined between the line segment from the end of the etching-blocking layer 135 to the lower end of the first planarization layer 107-1 and the second interlayer insulating layer 106 disposed at the lower end of the first anti-connection part 151 may decrease as the etching time increases.

Next, the photoresist PR is removed. For example, the photoresist PR may be removed by a wet process, but the present disclosure is not limited thereto.

Figure 7E:
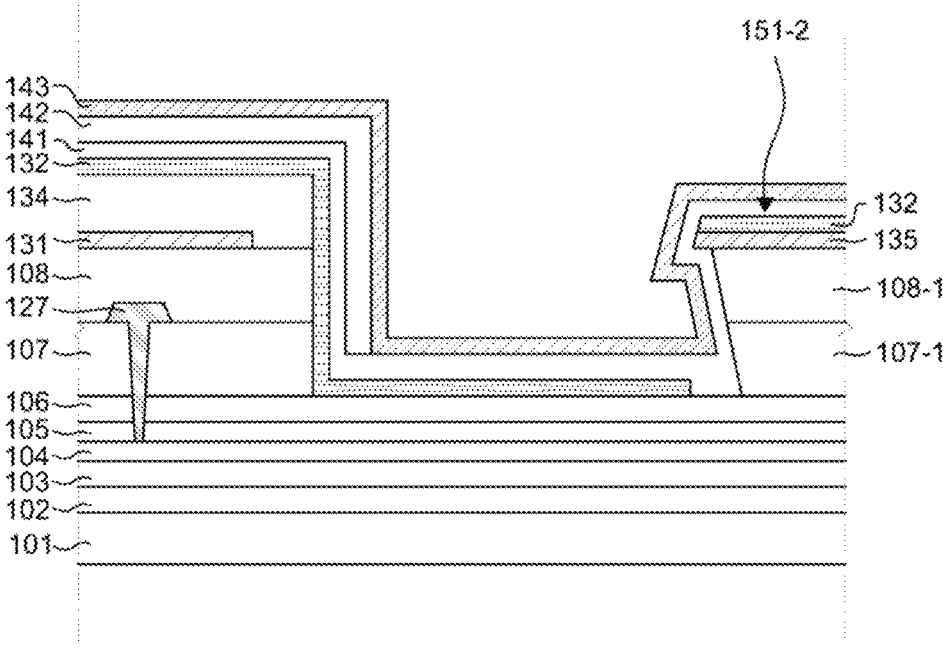

Referring to FIG. 7E, the light-emitting part 132 may be deposited on the bank 134 and the etching-blocking layer 135 of the first anti-connection part 151.

In this case, the second anti-connection structure 151-2 of the first anti-connection part 151 is formed such that the angle of the second anti-connection structure 151-2 is less than a particular angle formed by the primary and secondary dry etching process, such that the light-emitting part 132 may be deposited by being separated by the second anti-connection structure 151-2. Thereafter, the first inorganic insulating layer 141, the organic insulating layer 142, and the second inorganic insulating layer 143 may be formed. Since the organic insulating layer 142 is made of a liquid material, the application is blocked by the second anti-connection structure 151-2 of the first anti-connection part 151, such that the organic insulating layer 142 may be disposed only in the display area AA without being disposed on the first anti-connection part 151.

Figure 9:
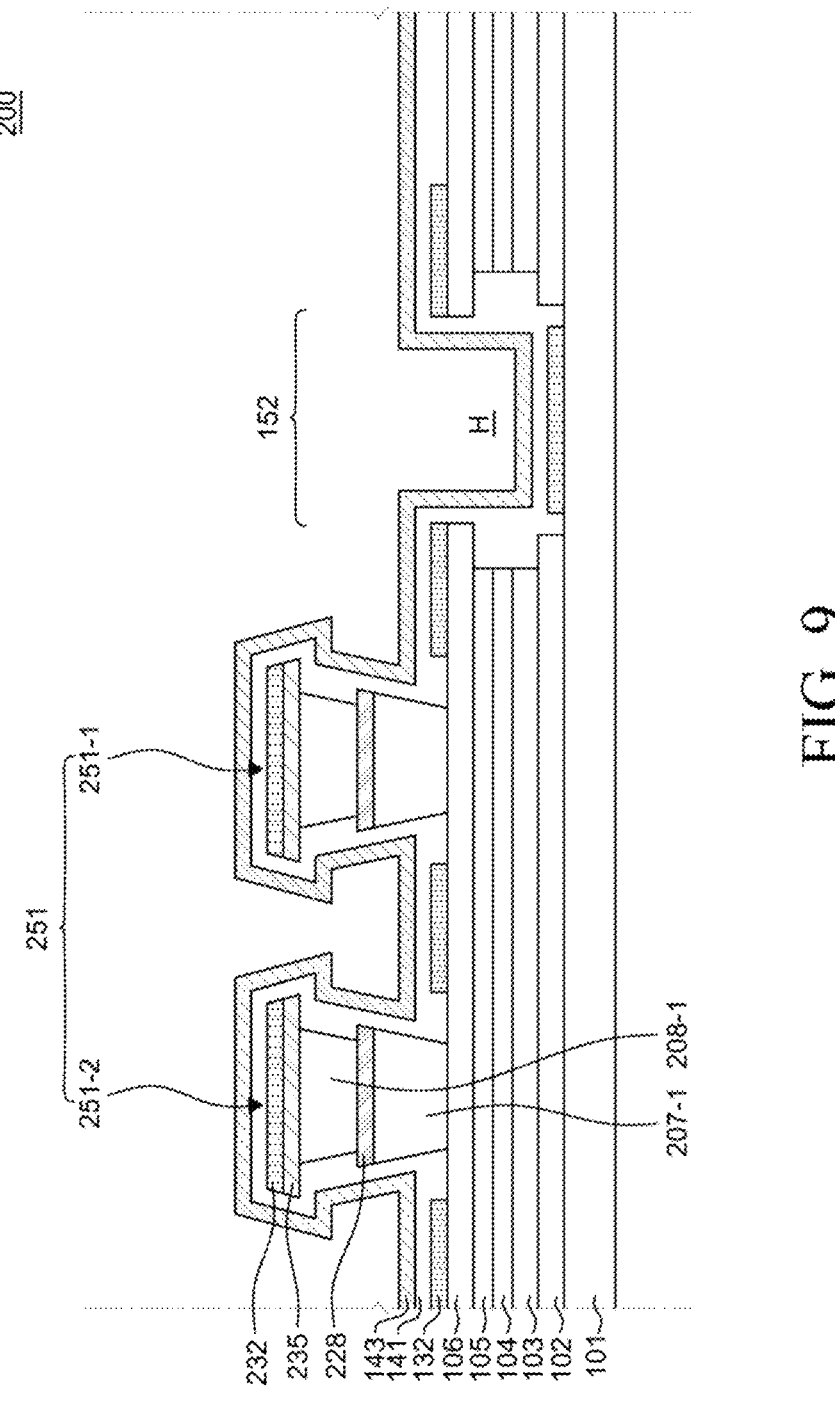
FIG. 9 is a cross-sectional view illustrating an anti-connection part in respect to an electroluminescent display device according to a second aspect of the present disclosure.

FIG. 9 is a cross-sectional view illustrating an anti-connection part in respect to an electroluminescent display device according to a second aspect of the present disclosure.

A display device 200 illustrated in FIG. 9 is substantially identical to the display device 100 illustrated in FIGS. 1 to 7, except that a first anti-connection part 251 further includes a metal layer 228. Therefore, repeated descriptions of the identical components will be omitted.

Referring to FIG. 9, the first anti-connection part 251 of the display device 200 according to the second aspect of the present disclosure may include a first anti-connection structure 251-1 and a second anti-connection structure 251-2.

The first anti-connection structure 251-1 and the second anti-connection structure 251-2 may each further include the metal layer 228 disposed between a first planarization layer 207-1 and a second planarization layer 208-1. In this case, the metal layer 228 may further protrude than the first planarization layer 207-1. For example, the metal layer 228 may be disposed on the same layer and made of the same material as the connection electrode 127 disposed in the display area AA. The metal layer 228 may be made of titanium (Ti), aluminum (Al), copper (Cu), molybdenum (Mo), aluminum-neodymium (AlNd), molybdenum-titanium (MoTi), and chromium (Cr), an alloy thereof, or a material made by stacking these materials.

In addition, the metal layer 228 may further protrude than the bottom surface of the second planarization layer 208-1, and the etching-blocking layer 235 may further protrude than the metal layer 228. However, the present disclosure is not limited thereto.

As described above, the first anti-connection part 251 has an undercut shape in which a width of a cross-section of an upper portion of the first anti-connection part 251 is larger than a width of a cross-section of a lower portion of the first anti-connection part 251. Therefore, the light-emitting part 232 may be easily separated from the first anti-connection part 251.

In this case, since the first anti-connection part 251 further includes the metal layer 228 disposed between the first planarization layer 207-1 and the second planarization layer 208-1 and further protruding than the first planarization layer 207-1, the single undercut structure may be formed between the first planarization layer 207-1 and the metal layer 228, and an additional undercut structure may be formed between the metal layer 228 and the etching-blocking layer 235. Therefore, the separation of the light-emitting part 232 may be facilitated by the two undercut structures at the time of depositing the light-emitting part 232.

In addition, the second aspect of the present disclosure may further ensure a level difference by a height of the metal layer 228 in comparison with the first aspect.

Figure 10:
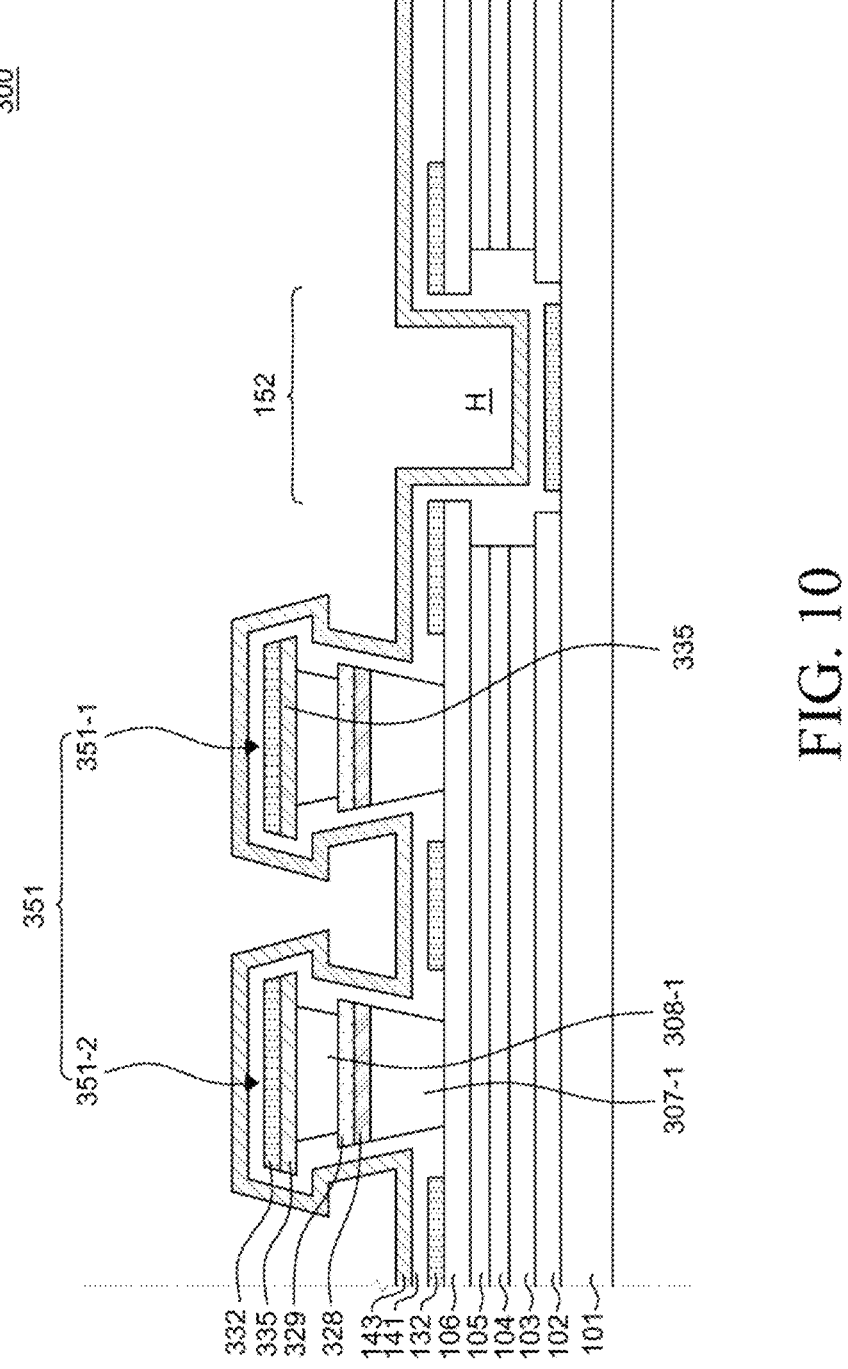
FIG. 10 is a cross-sectional view illustrating an anti-connection part in respect to an electroluminescent display device according to a third aspect of the present disclosure.

FIG. 10 is a cross-sectional view illustrating an anti-connection part in respect to an electroluminescent display device according to a third aspect of the present disclosure.

An electroluminescent display device 300 illustrated in FIG. 10 is substantially identical to the electroluminescent display device 200 illustrated in FIG. 9, except that a first anti-connection part 351 further includes an inorganic film 329 disposed on a metal layer 328. Therefore, repeated descriptions of the identical components will be omitted.

Referring to FIG. 10, the first anti-connection part 351 of the electroluminescent display device 300 according to the third aspect of the present disclosure may include a first anti-connection structure 351-1 and a second anti-connection structure 351-2.

Further, the first anti-connection structure 351-1 and the second anti-connection structure 351-2 may each further include the metal layer 328 and the inorganic film 329 disposed on the metal layer 328 disposed between the first planarization layer 307-1 and the second planarization layer 308-1. In this case, the metal layer 328 may further protrude than the first planarization layer 307-1. The inorganic film 329 may have the same end as the metal layer 328.

In addition, the inorganic film 329 may further protrude than the bottom surface of the second planarization layer 308-1, and the etching-blocking layer 335 may further protrude than the inorganic film 329. However, the present disclosure is not limited thereto.

As described above, the first anti-connection part 351 further includes: the metal layer 328 disposed between the first planarization layer 307-1 and the second planarization layer 308-1 and further protruding than the first planarization layer 307-1; and the inorganic film 329 disposed on the metal layer 328. Therefore, the single undercut structure may be formed between the first planarization layer 307-1 and the metal layer 328, and an additional undercut structure may be formed between the metal layer 328 and the etching-blocking layer 335. Therefore, the separation of the light-emitting part 132 may be further facilitated by the two undercut structures at the time of depositing the light-emitting part 132. In the case in which the inorganic film 329 made of silicon nitride (SiNx) is further disposed on the metal layer 328, the two undercut structures may be advantageously distinguished, such that the separation of the light-emitting part 132 may be further facilitated.

In addition, the third aspect of the present disclosure may further ensure a level difference by a height of the inorganic film 329 in comparison with the second aspect.

Figure 11:
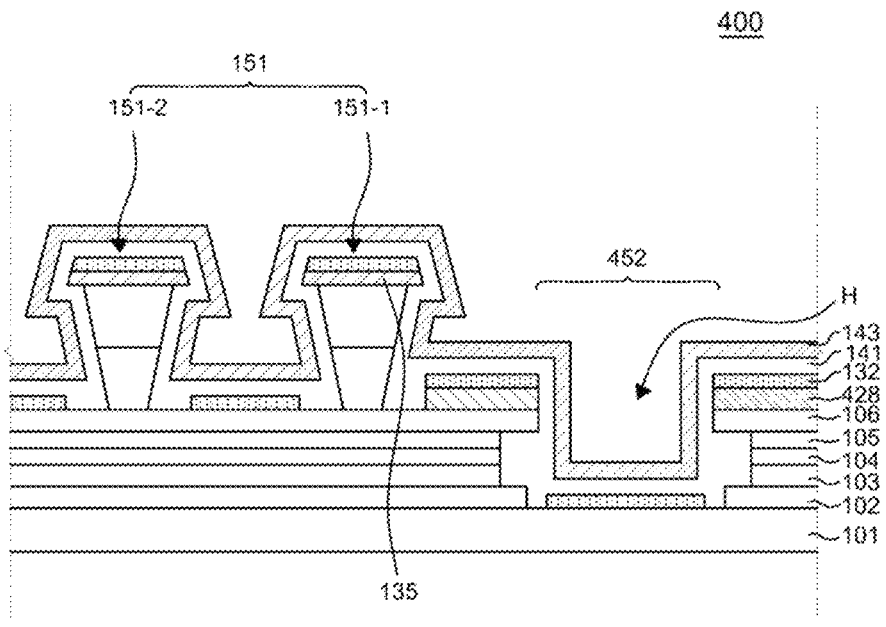
FIG. 11 is a cross-sectional view illustrating an anti-connection part in respect to an electroluminescent display device according to a fourth aspect of the present disclosure.

FIG. 11 is a cross-sectional view illustrating an anti-connection part in respect to an electroluminescent display device according to a fourth aspect of the present disclosure.

An electroluminescent display device 400 illustrated in FIG. 11 is substantially identical to the electroluminescent display device 100 illustrated in FIGS. 6A and 6B, except for a configuration of a second anti-connection part 452. Therefore, repeated descriptions of the identical components will be omitted.

Referring to FIG. 11, the second anti-connection part 452 of the electroluminescent display device 400 according to the fourth aspect of the present disclosure may include the first inorganic insulating film (first buffer layer 102), the second inorganic insulating films (second buffer layer 103, gate insulating layer 104, and first interlayer insulating layer 105), and the third inorganic insulating film (second interlayer insulating layer 106) and further include a metal tip 428 disposed on the third inorganic insulating film (second interlayer insulating layer 106). For example, the metal tip 428 may be disposed on the same layer and made of the same material as the source electrode 121 and the drain electrode 124 disposed in the display area AA.

As described above, the light-emitting part 132 may be easily separated from the second anti-connection part 452 by the anti-connection hole H. In this case, the metal tip 428, which further protrudes than the side surfaces of the second inorganic insulating films (second buffer layer 103, gate insulating layer 104, and first interlayer insulating layer 105), is disposed on the third inorganic insulating film (second interlayer insulating layer 106) constituting the second anti-connection part 452, and the anti-connection hole H is formed to penetrate the first inorganic insulating film (first buffer layer 102), the second inorganic insulating films (second buffer layer 103, gate insulating layer 104, and first interlayer insulating layer 105), the third inorganic insulating film (second interlayer insulating layer 106), and the metal tip 428. Therefore, as a height of the anti-connection hole H increases, a level difference of the second anti-connection part 452 also increases. Therefore, the separation of the light-emitting part 132 may be further facilitated at the time of depositing the light-emitting part 132 of the light-emitting element 130.

Hereinafter, a process of manufacturing the second anti-connection part 452 disposed in the through-hole area CHA will be described in more detail with reference to FIGS. 12A to 12E.

FIGS. 12A to 12F are cross-sectional views sequentially illustrating a part of a process of manufacturing a second anti-connection part illustrated in FIG. 11.

Figure 12A:
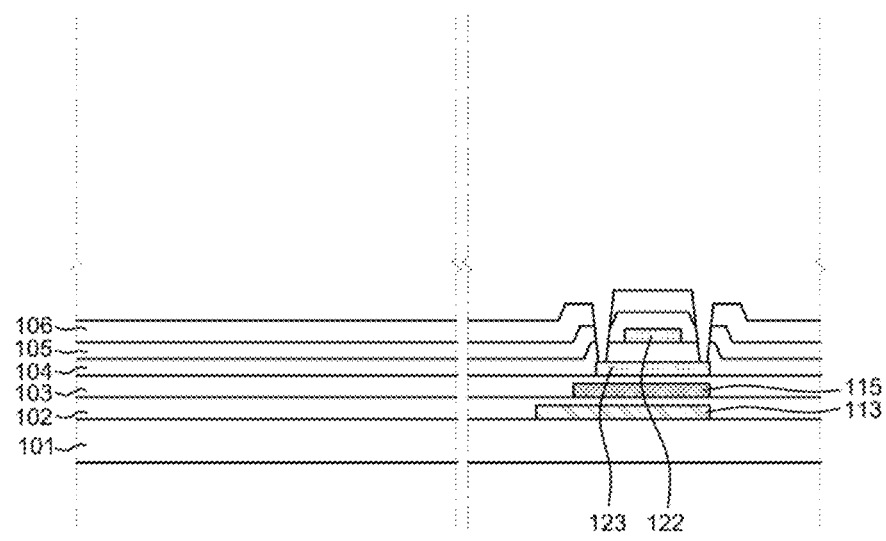
FIGS. 12A to 12F are cross-sectional views sequentially illustrating a part of a process of manufacturing a second anti-connection part illustrated in FIG. 11.

Referring to FIG. 12A, the substrate 101, the first buffer layer 102, the second buffer layer 103, the gate insulating layer 104, the first interlayer insulating layer 105, and the second interlayer insulating layer 106 may be sequentially stacked in the through-hole area CHA of the substrate 101.

Further, the substrate 101, the first light-blocking layer 113, the first buffer layer 102, the second light-blocking layer 115, the second buffer layer 103, the semiconductor layer 123, the gate insulating layer 104, the gate electrode 122, the first interlayer insulating layer 105, and the second interlayer insulating layer 106 may be sequentially stacked in the display area AA of the substrate 101. The contact hole connected to the semiconductor layer 123 may be formed in the gate insulating layer 104, the gate electrode 122, the first interlayer insulating layer 105, and the second interlayer insulating layer 106.

Figure 12B:
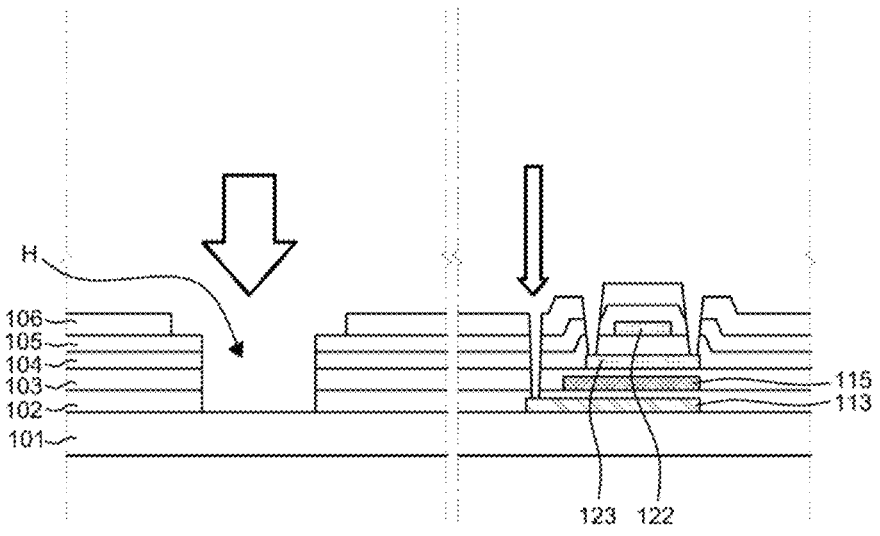

Next, referring to FIG. 12B, a contact mask layer is disposed on the upper portion of the substrate 101 and patterning is performed, such that the anti-connection hole H may be formed to correspond to the through-hole area CHA. In this case, a contact mask layer is a mask for performing the patterning so that the contact mask layer is in contact with the second interlayer insulating layer 106.

Next, after the patterning of the contact mask layer, the anti-connection hole H may be formed by dry etching the first buffer layer 102, the second buffer layer 103, the gate insulating layer 104, the first interlayer insulating layer 105, and the second interlayer insulating layer 106 corresponding to the through-hole area CHA on the upper portion of the substrate 101.

Figure 12C:
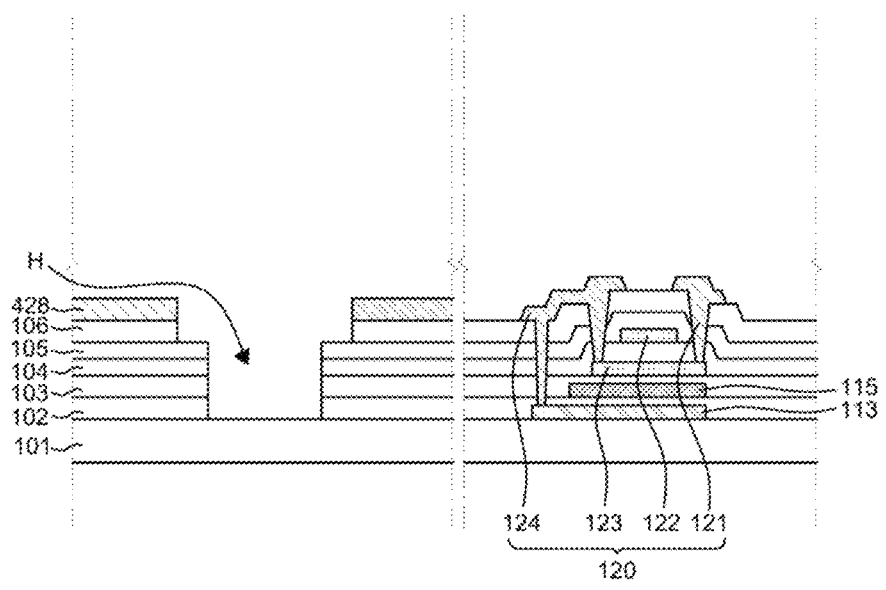

Next, referring to FIG. 12C, after performing the etching illustrated in FIG. 12B, the source electrode 121 and the drain electrode 124 are formed in the display area AA and the metal tip 428 is formed in the through-hole area CHA by using a metallic material, for example, magnesium (Mg), aluminum (Al), nickel (Ni), chromium (Cr), molybdenum (Mo), tungsten (W), gold (Au), or an alloy thereof.

Figure 12D:
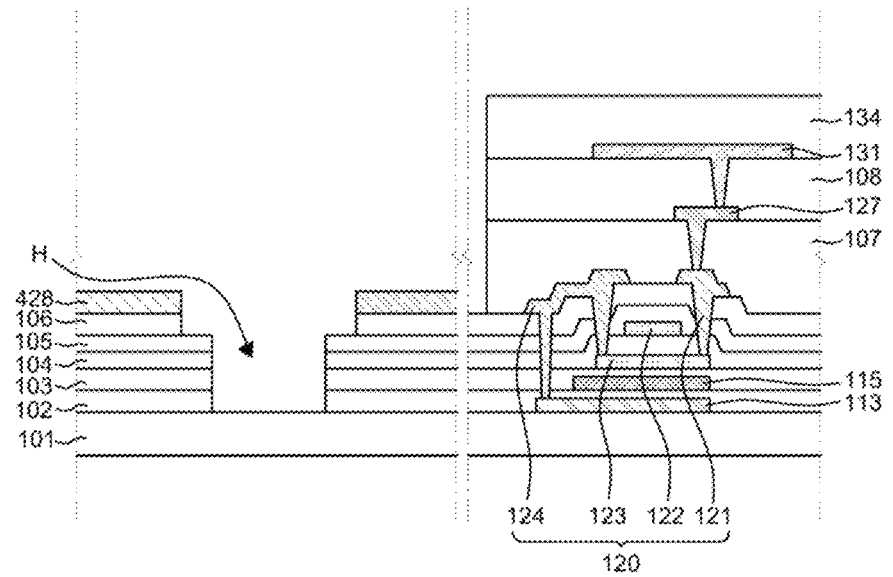

Next, referring to FIG. 12D, the lower planarization layer 107, the connection electrode 127, the upper planarization layer 108, the anode 131, and the bank 134 may be further formed in the display area AA.

Figure 12E:
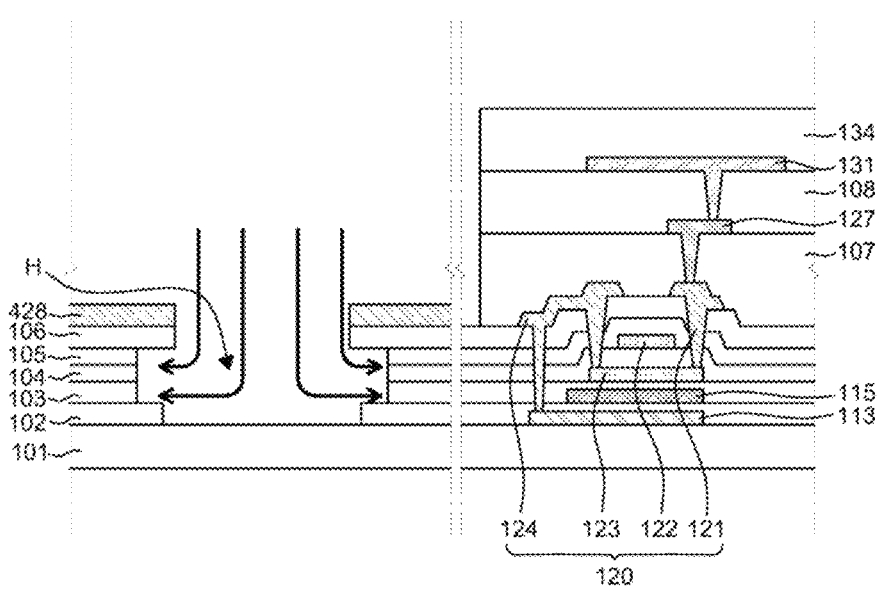

Thereafter, referring to FIG. 12E, a wet etching may be performed, by using an etchant, on the through-hole area CHA disposed in the anti-connection hole H. As described above, the first inorganic insulating film (first buffer layer 102), the second inorganic insulating films (second buffer layer 103, gate insulating layer 104, and first interlayer insulating layer 105), and the third inorganic insulating film (second interlayer insulating layer 106) are made by alternately stacking inorganic insulating films made of different materials. In this case, the inorganic insulating films made of different materials have different wet etching rates. Therefore, it is possible to adjust the shape of the anti-connection hole H by adjusting the etching rate. For example, the first inorganic insulating film (first buffer layer 102) and the third inorganic insulating film (second interlayer insulating layer 106) may be made of silicon nitride (SiNx). The second inorganic insulating films (second buffer layer 103, gate insulating layer 104, and first interlayer insulating layer 105) may be made of silicon oxide (SiOx). The etchant used for the wet etching according to the present disclosure may be a buffered oxide etchant (BOE) or a silicon (Si)-based oxide film etching solution. Therefore, the second inorganic insulating films (second buffer layer 103, gate insulating layer 104, and first interlayer insulating layer 105) made of silicon oxide (SiOx) have a higher etching rate than the first inorganic insulating film (first buffer layer 102) and the third inorganic insulating film (second interlayer insulating layer 106) made of silicon nitride (SiNx). Therefore, the side surfaces of the first inorganic insulating film (first buffer layer 102) and the third inorganic insulating film (second interlayer insulating layer 106) exposed through the anti-connection hole H may further protrude than the side surfaces of the second inorganic insulating films (second buffer layer 103, gate insulating layer 104, and first interlayer insulating layer 105).

Figure 12F:
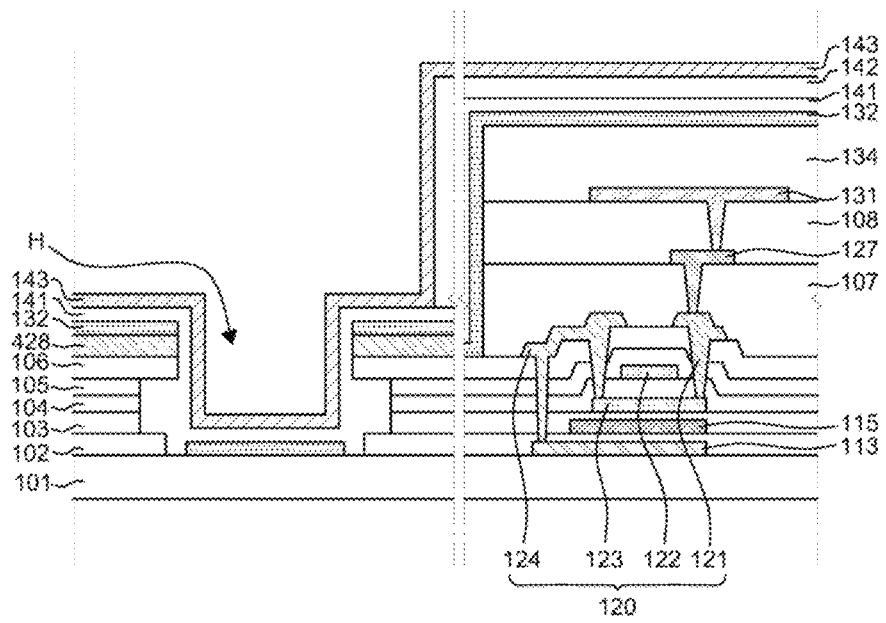

Next, referring to FIG. 12F, the light-emitting part 132 may be formed on the bank 134 and the second anti-connection part 452. In this case, in the case of the second anti-connection part 452, the light-emitting part 132 may be separated from the second anti-connection part 452 by the anti-connection hole H formed by the dry and wet etching processes. Thereafter, the first inorganic insulating layer 141, the organic insulating layer 142, and the second inorganic insulating layer 143 may be formed. In this case, the application of the organic insulating layer 142 made of a liquid material between the through-hole CH and the display area AA is blocked by the first anti-connection part 151 adjacent to the display area AA, such that the organic insulating layer 142 may be disposed only in the display area AA without overflowing to the through-hole area CHA.

Figure 13:
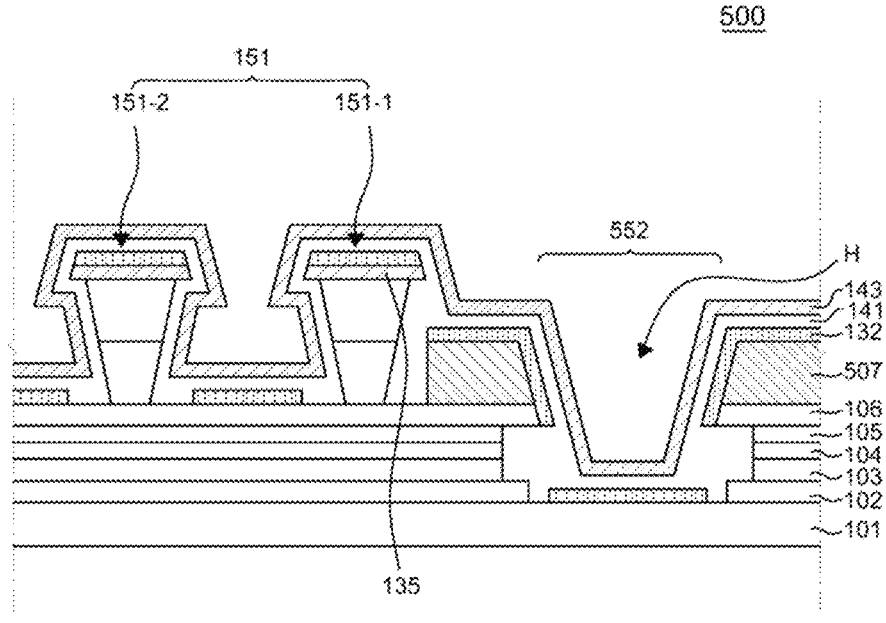
FIG. 13 is a cross-sectional view illustrating an anti-connection part in respect to an electroluminescent display device according to a fifth aspect of the present disclosure.

FIG. 13 is a cross-sectional view illustrating an anti-connection part in respect to an electroluminescent display device according to a fifth aspect of the present disclosure.

In this case, an electroluminescent display device 500 illustrated in FIG. 13 is substantially identical to the electroluminescent display device 400 illustrated in FIG. 11, except that the second anti-connection part 552 further includes a planarization layer 507 disposed on the third inorganic insulating film (second interlayer insulating layer 106) instead of the metal tip 428 disposed on the third inorganic insulating film (second interlayer insulating layer 106) illustrated in FIG. 11. Therefore, repeated descriptions of the identical components will be omitted.

Referring to FIG. 13, the second anti-connection part 552 of the electroluminescent display device 500 according to the fifth aspect of the present disclosure may further include the planarization layer 507 disposed on the first to third inorganic insulating films. For example, the planarization layer 507 may be disposed on the same layer and made of the same material as the lower planarization layer 107 disposed in the display area AA.

As described above, the light-emitting part 132 may be easily separated from the second anti-connection part 552 by the anti-connection hole H. In this case, the planarization layer 507 is disposed on the third inorganic insulating film (second interlayer insulating layer 106) constituting the second anti-connection part, and the anti-connection hole His formed to penetrate the first inorganic insulating film (first buffer layer 102), the second inorganic insulating films (second buffer layer 103, gate insulating layer 104, and first interlayer insulating layer 105), the third inorganic insulating film (second interlayer insulating layer 106), and the planarization layer 507. Therefore, as a height of the anti-connection hole H increases, a level difference of the second anti-connection part 552 also increases. Therefore, the separation of the light-emitting part 132 from the second anti-connection part 552 may be further facilitated at the time of depositing the light-emitting part 132 of the light-emitting element 130.

Figure 14:
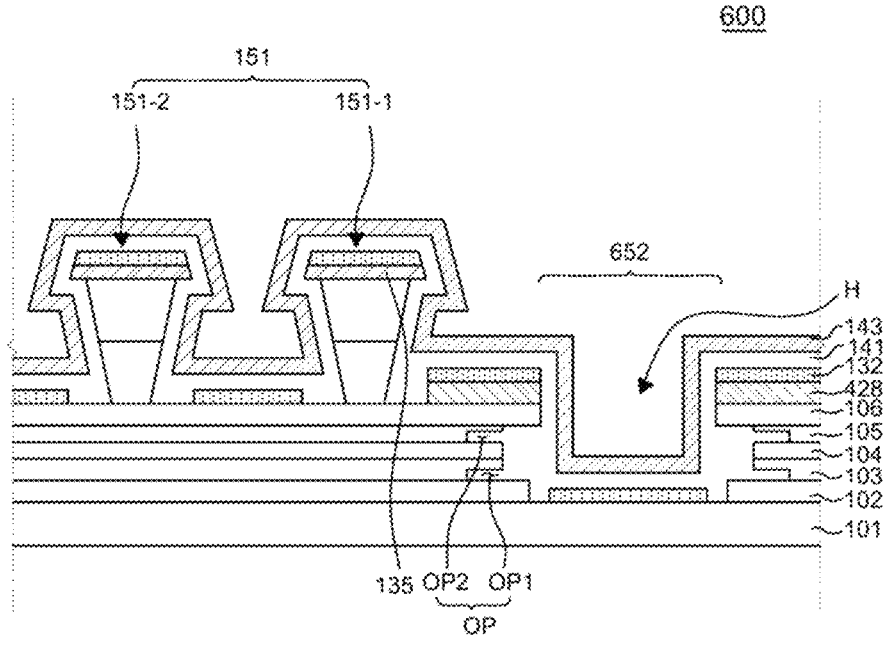
FIG. 14 is a cross-sectional view illustrating an anti-connection part in respect to an electroluminescent display device according to a sixth aspect of the present disclosure.

FIG. 14 is a cross-sectional view illustrating an anti-connection part in respect to an electroluminescent display device according to a sixth aspect of the present disclosure.

An electroluminescent display device 600 illustrated in FIG. 14 is substantially identical to the electroluminescent display device 100 illustrated in FIGS. 6A and 6B, except for an opening portion OP included in a second anti-connection part 652. Therefore, repeated descriptions of the identical components will be omitted.

Referring to FIG. 14, the second anti-connection part 652 of the electroluminescent display device 600 according to the sixth aspect of the present disclosure may include a plurality of opening portions OP disposed on the second inorganic insulating film.

The second anti-connection part 652 according to the sixth aspect of the present disclosure includes: a first opening portion OP1 disposed between the first inorganic insulating film (first buffer layer 102) and the second inorganic insulating films (second buffer layer 103, gate insulating layer 104, and first interlayer insulating layer 105), and a second opening portion OP2 disposed between the second inorganic insulating films (second buffer layer 103, gate insulating layer 104, and first interlayer insulating layer 105) and the third inorganic insulating film (second interlayer insulating layer 106) Therefore, the side surfaces of the second inorganic insulating films (second buffer layer 103, gate insulating layer 104, and first interlayer insulating layer 105) exposed through the anti-connection hole H may each have a concave-convex surface.

As described above, the light-emitting part 132 may be easily separated from the second anti-connection part 652 by the anti-connection hole H. In this case, the opening portions OP are provided so that the side surfaces of the first inorganic insulating film (first buffer layer 102), the second inorganic insulating films (second buffer layer 103, gate insulating layer 104, and first interlayer insulating layer 105), and the third inorganic insulating film (second interlayer insulating layer 106), which constitute the second anti-connection part 652, each have the concave-convex surface, such that a length of the anti-connection hole H increases. Therefore, the deposition on the entire surface of the anti-connection hole H is hardly performed at the time of depositing the light-emitting part 132 of the light-emitting element 130. Therefore, the separation of the light-emitting part 132 may be facilitated.

Hereinafter, a process of manufacturing the second anti-connection part 652 disposed in the through-hole area CHA will be described in more detail with reference to FIGS. 15A to 15F.

FIGS. 15A to 15F are cross-sectional views sequentially illustrating a part of a process of manufacturing a second anti-connection part illustrated in FIG. 14.

The manufacturing process illustrated in FIGS. 15A to 15F is substantially identical to the manufacturing process illustrated in FIGS. 12A to 12E, except that the opening portion OP is further formed. Therefore, repeated descriptions of the identical components will be omitted.

Figure 15A:
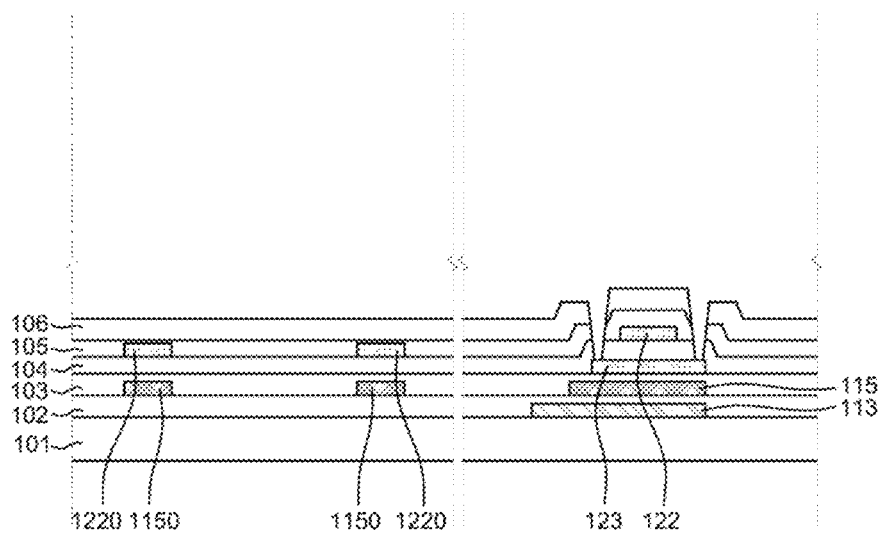
FIGS. 15A to 15F are cross-sectional views sequentially illustrating a part of a process of manufacturing a second anti-connection part illustrated in FIG. 14.

Referring to FIG. 15A, a first opening pattern 1150 disposed on the same layer and made of the same material as the second light-blocking layer 115 may be formed on the first buffer layer 102 of the substrate 101 disposed in the through-hole area CHA. A second opening pattern 1220 disposed on the same layer and made of the same material as the gate electrode in the display area AA may be formed on the gate insulating layer 104 so as to overlap the first opening pattern 1150.

Figure 15B:
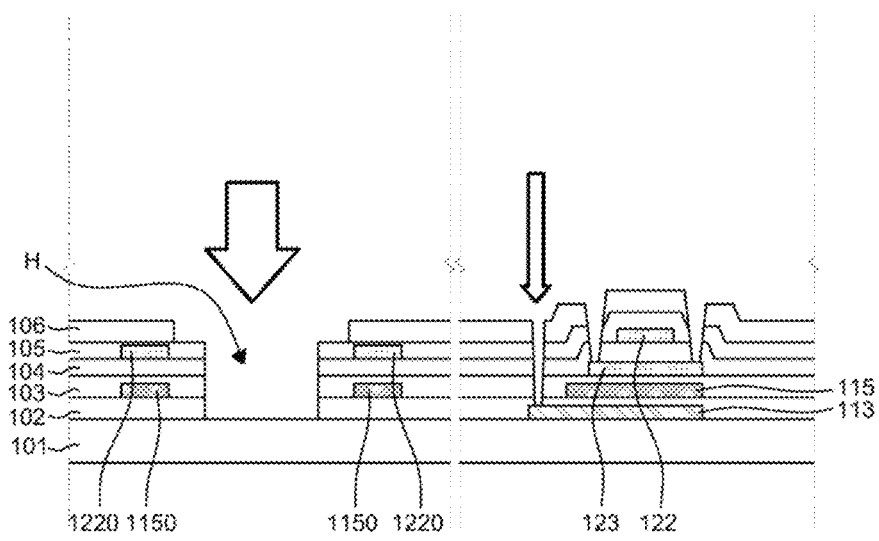
Figure 15C:
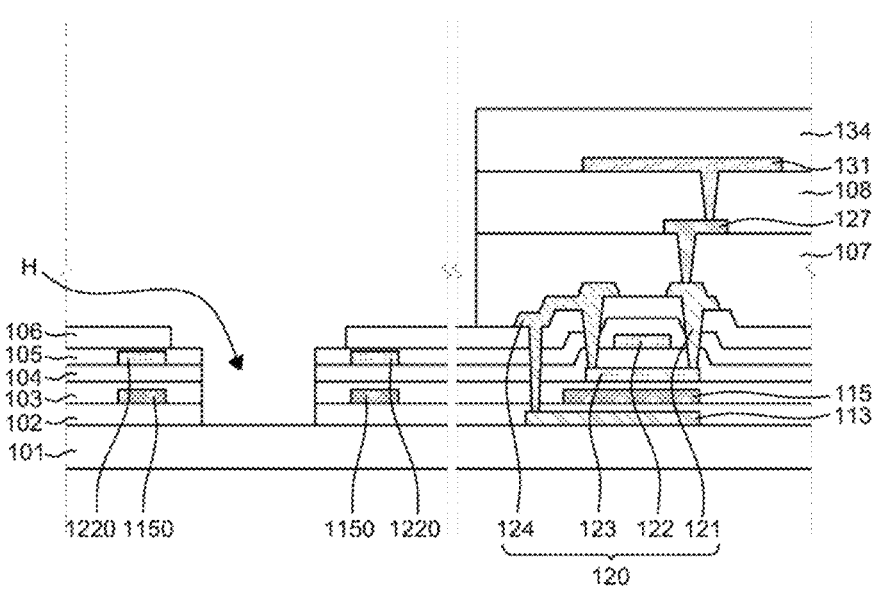

Next, referring to FIGS. 15B and 15C, similar to the process illustrated in FIGS. 12B to 12D, the contact mask layer is disposed on the entire surface of the upper portion of the substrate 101, and then patterning and dry etching are performed to form the anti-connection hole H by etching the first inorganic insulating film (first buffer layer 102), the second inorganic insulating films (second buffer layer 103, gate insulating layer 104, and first interlayer insulating layer 105), and the third inorganic insulating film (second inter-layer insulating layer 106) corresponding to the through-hole area CHA on the substrate 101. Further, the source electrode 121 and the drain electrode 124 may be formed in the display area AA by using a metallic material, and the lower planarization layer 107, the connection electrode 127, the upper planarization layer 108, the anode 131, and the bank 134 may be formed to cover the source electrode 121 and the drain electrode 124.

Figure 15D:
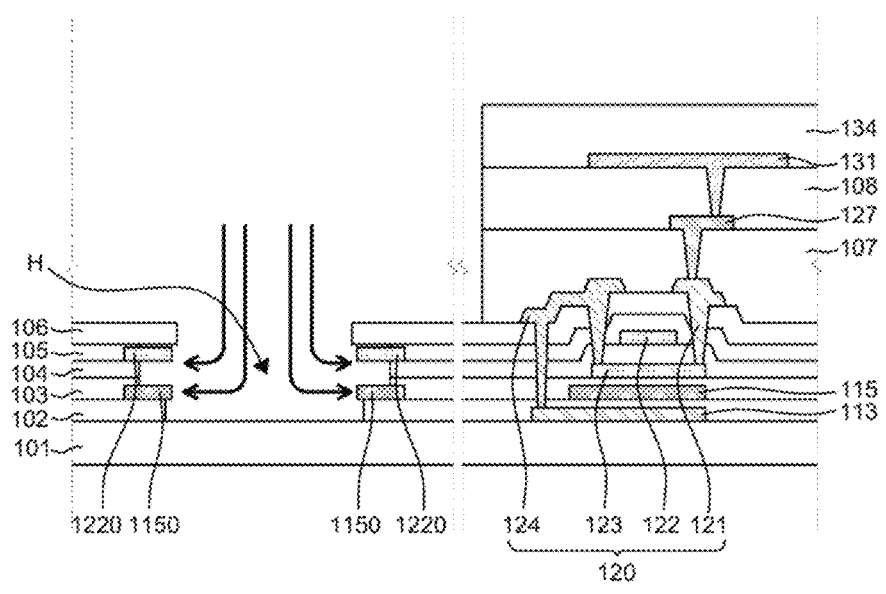

Thereafter, referring to FIG. 15D, a primary wet etching may be performed, by using a first etchant, on the through-hole area CHA in which the anti-connection hole H is disposed. Therefore, the side surfaces of the first inorganic insulating film (first buffer layer 102), the second inorganic insulating films (second buffer layer 103, gate insulating layer 104, and first interlayer insulating layer 105), and the third inorganic insulating film (second interlayer insulating layer 106) may be further etched.

As described above, the first inorganic insulating film (first buffer layer 102), the second inorganic insulating films (second buffer layer 103, gate insulating layer 104, and first interlayer insulating layer 105), and the third inorganic insulating film (second interlayer insulating layer 106) are made by alternately stacking inorganic insulating films made of different materials, such that the first inorganic insulating film (first buffer layer 102), the second inorganic insulating films (second buffer layer 103, gate insulating layer 104, and first interlayer insulating layer 105), and the third inorganic insulating film (second interlayer insulating layer 106) have different wet etching rates. Therefore, the side surfaces of the first inorganic insulating film (first buffer layer 102) and the third inorganic insulating film (second interlayer insulating layer 106) exposed through the anti-connection hole H are formed to further protrude than the side surfaces of the second inorganic insulating films (second buffer layer 103, gate insulating layer 104, and first interlayer insulating layer 105). In this case, the first opening pattern 1150 and the second opening pattern 1220 disposed in the through-hole area CHA may be exposed through the anti-connection hole H.

Figure 15E:
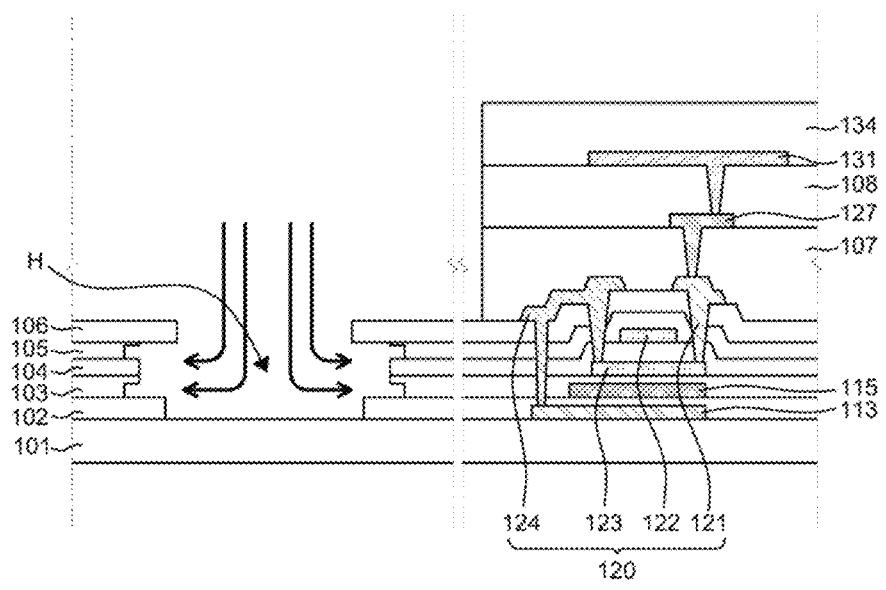

Thereafter, referring to FIG. 15E, a secondary wet etching may be performed, by using a second etchant, on the through-hole area CHA in which the anti-connection hole H is disposed. The second etchant may be an etchant for metal etching, particularly, copper (Cu)/molybdenum-titanium (MoTi) etchant. The first inorganic insulating film (first buffer layer 102), the second inorganic insulating films 103, 104, and 105 (second buffer layer 103, gate insulating layer 104, and first interlayer insulating layer 105), and the third inorganic insulating film (second interlayer insulating layer 106) are not etched by the secondary wet etching, only the first opening pattern 1150 and the second opening pattern

1220 made of metal are selectively etched, such that the first opening portion OP1 and the second opening portion OP2 may be formed.

Figure 15F:
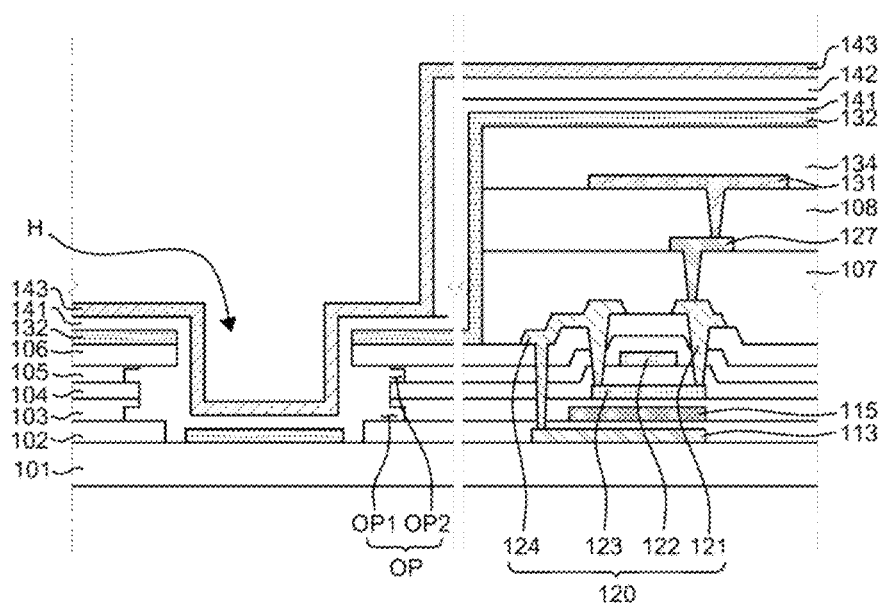

Next, referring to FIG. 15F, the light-emitting part 132 may be formed on the bank 134 and the second anti-connection part 652. In this case, in the case of the second anti-connection part 652, the light-emitting part 132 of the light-emitting element 130 may be separated from the second anti-connection part 652 by the anti-connection hole H formed by performing the dry etching process and the two wet etching processes. Next, the first inorganic insulating layer 141, the organic insulating layer 142, and the second inorganic insulating layer 143 may be formed. In this case, the application of the organic insulating layer 142 made of a liquid material between the through-hole CH and the display area AA is blocked by the first anti-connection part 151 adjacent to the display area AA, such that the organic insulating layer 142 may be formed only in the display area AA without overflowing to the through-hole area CHA.

Figure 16:
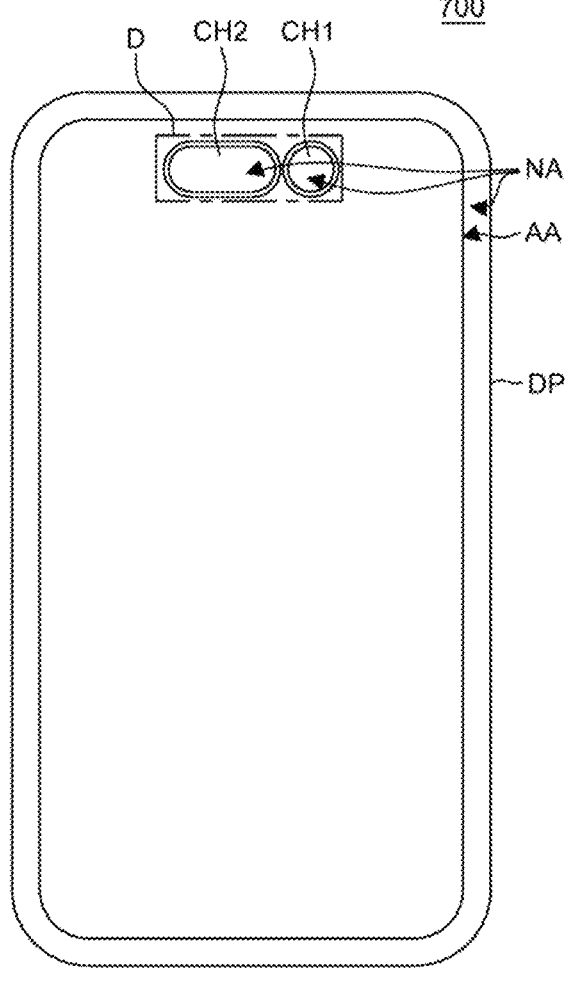
FIG. 16 is a top plan view of an electroluminescent display device according to a seventh aspect of the present disclosure.

FIG. 16 is a top plan view of an electroluminescent display device according to a seventh aspect of the present disclosure.

An electroluminescent display device 700 illustrated in FIG. 16 is substantially identical to the electroluminescent display device 100 illustrated in FIG. 1, except that a second through-hole CH2 is further included. Further, the second through-hole CH2 is substantially identical in configuration to the first through-hole CH1. Therefore, repeated descriptions of the identical components will be omitted.

Referring to FIG. 16, the through-hole capable of accommodating a camera and a sensor therein may include a first through-hole CH1 and a second through-hole CH2 disposed adjacent to the first through-hole CH1. In this case, the first through-hole CH1 and the second through-hole CH2 may each accommodate the camera and the sensor. Alternatively, the first through-hole CH1 may accommodate the camera, and the second through-hole CH2 may accommodate a distance detection sensor or a face recognition sensor and a wide-angle camera. However, the present disclosure is not limited thereto.

Hereinafter, a relationship between a first through-hole area CHA1 in which the first through-hole CH1 is disposed and a second through-hole area CHA2 in which the second through-hole CH2 is disposed will be described in more detail with reference to FIGS. 17 and 18.

Figure 17:
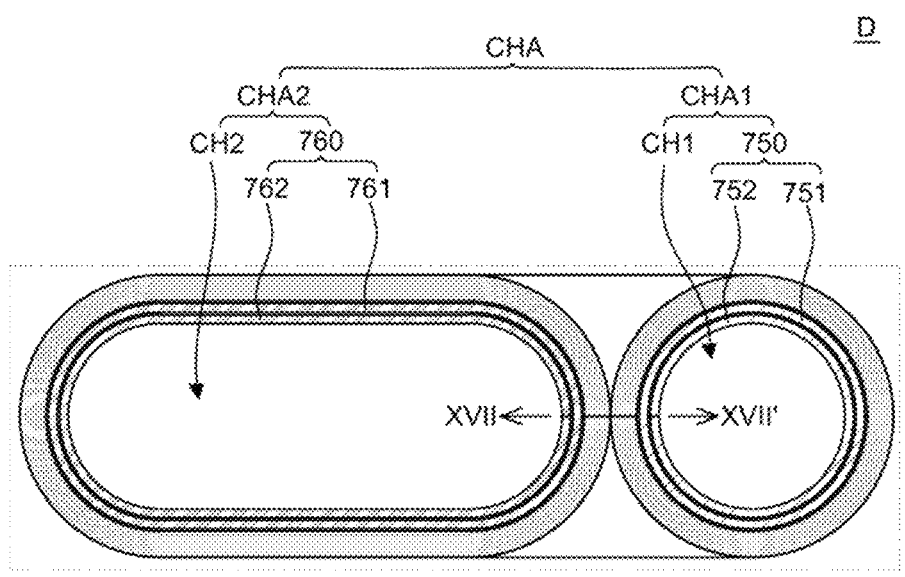
FIG. 17 is an enlarged top plan view of part D in FIG. 16.

FIG. 17 is an enlarged top plan view of part D in FIG. 16.

Figure 18:
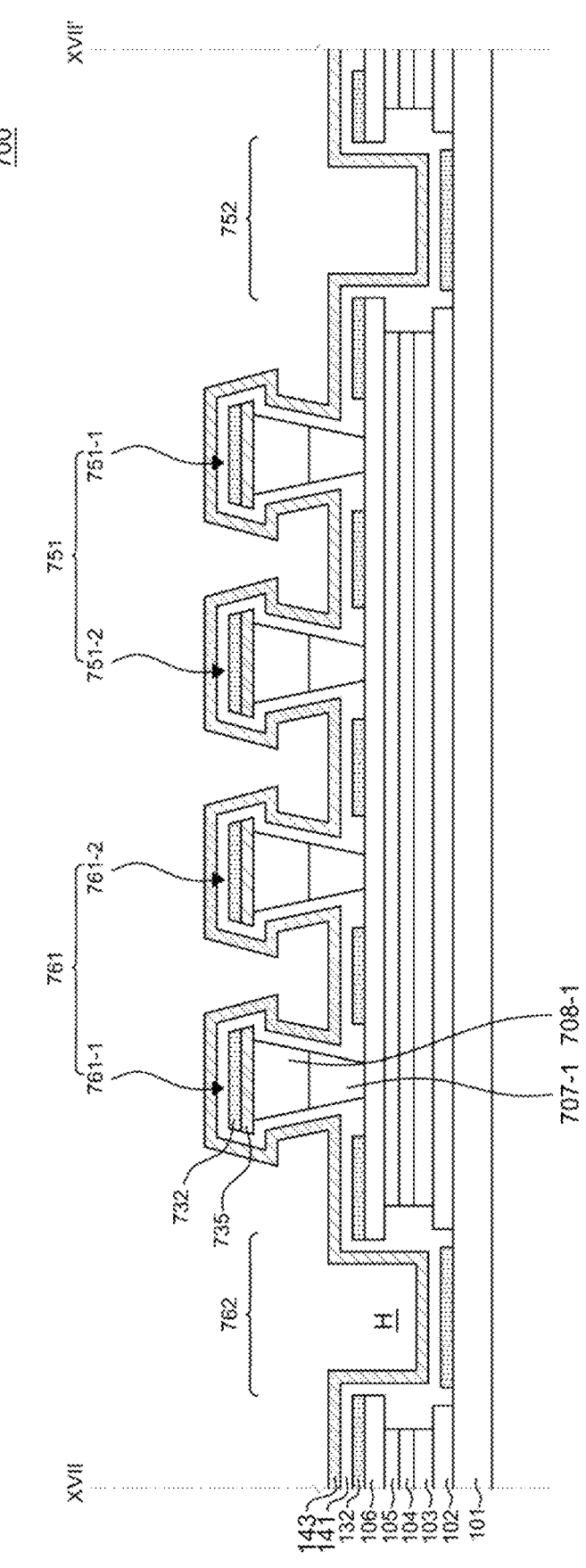
FIG. 18 is a cross-sectional view taken along line XVII-XVII' in FIG. 17.

FIG. 18 is a cross-sectional view taken along line XVII-XVII' in FIG. 17.

The through-hole area CHA illustrated in FIGS. 17 and 18 is substantially identical to the through-hole area CHA illustrated in FIGS. 4 and 6, except that two through-hole areas are provided. Therefore, repeated descriptions of the identical components will be omitted.

Referring to FIG. 17, the through-hole area CHA may include the first through-hole area CHA1 in which the first through-hole CH1 is disposed, and the second through-hole area CHA2 in which the second through-hole CH2 is disposed. The first through-hole area CHA1 may include the first through-hole CH1, a second anti-connection part 752 configured to surround the first through-hole CH1, and a first anti-connection part 751 configured to surround the second anti-connection part 752. The second through-hole area CHA2 disposed adjacent to the first through-hole area CHA1 may include the second through-hole CH2, a fourth anti-connection part 762 configured to surround the second through-hole CH2, and a third anti-connection part 761 configured to surround the fourth anti-connection part 762.

In this case, the configurations of the first anti-connection part 751 and the third anti-connection part 761 are substantially identical to those of the first anti-connection part 151 illustrated in FIGS. 1 to 6, and the configurations of the second anti-connection part 752 and the fourth anti-connection part 762 are substantially identical to those of the second anti-connection part 152 illustrated in FIGS. 1 to 6. Therefore, repeated descriptions of the identical components will be omitted.

Referring to FIGS. 17 and 18, the first through-hole area CHA1 and the second through-hole area CHA2 of the through-hole area CHA may be disposed to be in contact with each other on at least one point, specifically, the first anti-connection part 751 in the first through-hole area CHA1 and the third anti-connection part 761 in the second through-hole area CHA2 may be disposed to be in contact with each other on at least one point. Referring to a cross-sectional structure of a portion where the first through-hole area CHA1 and the second through-hole area CHA2 of the through-hole area CHA are in contact with each other, the second through-hole CH2, the fourth anti-connection part 762, the third anti-connection part 761, the first anti-connection part 751, the second anti-connection part 752, and the first through-hole CH1 may be sequentially disposed in the through-hole area CHA.

In this case, the first anti-connection part 751 and the third anti-connection part 761, which each include a first planarization layer 707-1, a second planarization layer 708-1 disposed on the first planarization layer 707-1, an etching-blocking layer 735 disposed on the second planarization layer 708-1, each have an undercut shape in which a bottom surface of the first planarization layer 707-1 is narrower than a top surface of the etching-blocking layer 735. Therefore, the light-emitting part 732 cannot cover all the side surfaces of the first anti-connection part 751 and the third anti-connection part 761 even though the light-emitting part 732 of the light-emitting element 130 is deposited. Therefore, the light-emitting part 732 is disconnected, as illustrated in FIG. 18. Therefore, the light-emitting part 132 of the light-emitting element 130 may be disconnected on the first anti-connection part 751 and the third anti-connection part 761.

In addition, since the second anti-connection part 752 and the fourth anti-connection part 762 each include the anti-connection hole H that penetrates the first inorganic insulating film (first buffer layer 102), the second inorganic insulating films (second buffer layer 103, gate insulating layer 104, and first interlayer insulating layer 105), and the third insulating film (second interlayer insulating layer 106). Therefore, the light-emitting part 732 is disconnected by the anti-connection hole H that penetrates the first inorganic insulating film (first buffer layer 102), the second inorganic insulating films (second buffer layer 103, gate insulating layer 104, and first interlayer insulating layer 105), and the third inorganic insulating film (second interlayer insulating layer 106) at the time of depositing the light-emitting part 732. Therefore, the second anti-connection part 752 and the fourth anti-connection part 762 may further facilitate the separation of the light-emitting part 732 of the light-emitting element 130.

In addition, even if a crack is formed in any one of the first inorganic insulating film (first buffer layer 102), the second inorganic insulating films (second buffer layer 103, gate insulating layer 104, and first interlayer insulating layer 105), and the third inorganic insulating film (second interlayer insulating layer 106) at the time of forming the first through-hole CH1 and the second through-hole CH2 by using the laser, the anti-connection hole H formed in the first inorganic insulating film (first buffer layer 102), the second inorganic insulating films (second buffer layer 103, gate insulating layer 104. and first interlayer insulating layer 105), and the third inorganic insulating film (second interlayer insulating layer 106) may inhibit the crack from being spread in a direction of the display area AA.

Meanwhile, when the two through-holes according to the seventh aspect of the present disclosure are provided, the first anti-connection part 751 and the third anti-connection part 761 may be disposed to be in contact with each other on at least one point. Therefore, at least any one of the first anti-connection structures 751-1 and 761-1 and the second anti-connection structures 751-2 and 761-2 respectively included in the first anti-connection part 751 and the third anti-connection part 762 that perform the same function may be omitted. Even though at least any one of the first anti-connection structures 751-1 and 761-1 and the second anti-connection structures 751-2 and 761-2 is omitted, the function of disconnecting the light-emitting part 132 may be performed. Therefore, a distance between the first through-hole CH1 and the second through-hole CH2 may be further minimized.

The exemplary aspects of the present disclosure can also be described as follows:

According to an aspect of the present disclosure, there is provided an electroluminescent display device. The electroluminescent display device includes a substrate including a display area surrounding a through-hole and a non-display area disposed between the display area and the through-hole, a thin-film transistor disposed on an upper portion of the display area and a light-emitting element connected to the thin-film transistor, a plurality of insulating layers disposed between the substrate and the thin-film transistor, a planarization layer disposed between the thin-film transistor and the light-emitting element and at least one anti-connection part disposed in the non-display area and including the plurality of insulating layers and the planarization layer, wherein the planarization layer and the plurality of insulating layers which constitute the anti-connection part, and each of the planarization layer and the plurality of insulating layers has an undercut shape in which a bottom surface is narrower than a top surface.

The at least one anti-connection part may include a first anti-connection part provided between the through-hole and the display area and disposed adjacent to the display area and a second anti-connection part provided between the through-hole and the display area and disposed adjacent to the through-hole.

The planarization layer of the first anti-connection part may have the undercut shape, and each of the plurality of insulating layers of the second anti-connection part may have the undercut shape.

The first anti-connection part may include a first planarization layer, a second planarization layer disposed on the first planarization layer, an etching-blocking layer disposed on the second planarization layer and a light-emitting part of the light-emitting element disposed on the etching-blocking layer.

The etching-blocking layer may be disposed on a same layer and made of a same material as a first electrode of the light-emitting element.

The first anti-connection part may satisfy Expression 1 below, [Expression 1] $\Delta x \geq 2.1y$ where $\Delta x$ may represent a distance to which a bottom surface of the first planarization layer is recessed inward at an end of the etching-blocking layer, and y may represent a sum of heights of the first and second planarization layers.

The first anti-connection part may further include a metal layer disposed between the first planarization layer and the second planarization layer, and the metal layer may further protrude than the first planarization layer.

The metal layer may be disposed on a same layer and made of a same material as a connection electrode connected to the thin-film transistor.

The metal layer may further protrude than a bottom surface of the second planarization layer, and the etching-blocking layer may further protrude than the metal layer.

The electroluminescent display device may further include an inorganic film disposed between the metal layer and the second planarization layer and made of silicon nitride.

The inorganic film may further protrude than a bottom surface of the second planarization layer, and the etching-blocking layer may further protrude than the inorganic film.

The second anti-connection part may include at least one anti-connection hole and a first inorganic insulating film, a second inorganic insulating film disposed on the first inorganic insulating film, and a third inorganic insulating film disposed on the second inorganic insulating film, and wherein the first inorganic insulating film, the second inorganic insulating film, and the third inorganic insulating film may be disposed around the anti-connection hole and made of different materials.

The anti-connection hole may expose a surface of the substrate, and a light-emitting part of the light-emitting element may be disposed on the exposed surface of the substrate so as to be disconnected from a periphery.

The first inorganic insulating film, the second inorganic insulating film, and the third inorganic insulating film may be partially removed by the anti-connection hole.

Side surfaces of the first inorganic insulating film and the third inorganic insulating film exposed through the anti-connection hole may further protrude than a side surface of the second inorganic insulating film.

The first inorganic insulating film and the third inorganic insulating film may be made of silicon nitride (SiNx), and the second inorganic insulating film is made of silicon oxide (SiOx).

The first inorganic insulating film may include a first buffer layer, and the third inorganic insulating film may include a second interlayer insulating layer.

The second inorganic insulating film may include a second buffer layer disposed on the first buffer layer, a gate insulating layer disposed on the second buffer layer and a first interlayer insulating layer disposed on the gate insulating layer, and wherein side surfaces of the first buffer layer, the second buffer layer, the gate insulating layer, and the first interlayer insulating layer exposed through the anti-connection hole may each have a concave-convex surface.

The electroluminescent display device may further include a metal tip disposed on the third inorganic insulating film, wherein a side surface of the metal tip may further protrude than a side surface of the second inorganic insulating film.

The thin-film transistor may include a semiconductor layer, a gate electrode, a source electrode, and a drain electrode, and the semiconductor layer may be made of an oxide semiconductor.

The through-hole may include a first through-hole and a second through-hole disposed adjacent to the first through-hole, wherein the at least one anti-connection part may include a second anti-connection part configured to surround the first through-hole and a first anti-connection part configured to surround the second anti-connection part and a fourth anti-connection part configured to surround the second through-hole and a third anti-connection part configured to surround the fourth anti-connection part, wherein the planarization layer of each of the first anti-connection part and the third anti-connection part may have the undercut shape, and wherein the plurality of insulating layers of each of the second anti-connection part and the fourth anti-connection part each may have the undercut shape.

The first anti-connection part and the third anti-connection part may be in contact with each other on at least one point.

The first anti-connection part and the third anti-connection part each may include a first planarization layer, a second planarization layer disposed on the first planarization layer, an etching-blocking layer disposed on the second planarization layer and a light-emitting part of the light-emitting element disposed on the etching-blocking layer.

Each of the first anti-connection part and the third anti-connection part may include a metal layer disposed between the first planarization layer and the second planarization layer, and the metal layer may further protrude than the first planarization layer.

The electroluminescent display device may further include an inorganic film disposed between the metal layer and the second planarization layer and made of silicon nitride.

Each of the second anti-connection part and the fourth anti-connection part may include at least one anti-connection hole and a first inorganic insulating film, a second inorganic insulating film disposed on the first inorganic insulating film, and a third inorganic insulating film disposed on the second inorganic insulating film, and wherein the first inorganic insulating film, the second inorganic insulating film, and the third inorganic insulating film may be disposed around the anti-connection hole and made of different materials.

Side surfaces of the first inorganic insulating film and the third inorganic insulating film exposed through the anti-connection hole may further protrude than a side surface of the second inorganic insulating film.

The electroluminescent display device may further include a metal tip disposed on the third inorganic insulating film, wherein a side surface of the metal tip may further protrude than a side surface of the second inorganic insulating film.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescent display device comprising:
a substrate including a display area surrounding a through-hole and a non-display area disposed between the display area and the through-hole;
a thin-film transistor disposed on an upper portion of the display area and a light-emitting element connected to the thin-film transistor;
a plurality of insulating layers disposed over the substrate;
a planarization layer disposed between the plurality of insulating layers and the light-emitting element; and
at least one anti-connection part disposed in the non-display area and including the plurality of insulating layers and the planarization layer,
the at least one anti-connection part comprising:
a first anti-connection part provided between the through-hole and the display area and disposed adjacent to the display area, and
a second anti-connection part provided between the through-hole and the display area and disposed adjacent to the through-hole,
wherein the planarization layer of the first anti-connection part has an undercut shape in which a bottom surface is narrower than a top surface and the plurality of insulating layers of the second anti-connection part has an undercut shape in which a bottom surface is narrower than a top surface.

2. The electroluminescent display device of claim 1, wherein the first anti-connection part comprises:
a first planarization layer;
a second planarization layer disposed on the first planarization layer;
an etching-blocking layer disposed on the second planarization layer; and
a light-emitting part of the light-emitting element disposed on the etching-blocking layer.

3. The electroluminescent display device of claim 2, wherein the etching-blocking layer is disposed on a same layer and made of a same material as a first electrode of the light-emitting element.

4. The electroluminescent display device of claim 2, wherein the first anti-connection part satisfies Expression 1 below, $$\Delta x \geq 2.1y \qquad \text{[Expression 1]}$$

where $\Delta x$ represents a distance to which a bottom surface of the first planarization layer is recessed inward at an end of the etching-blocking layer, and y represents a sum of heights of the first and second planarization layers.

5. The electroluminescent display device of claim 2, wherein the first anti-connection part further comprises a metal layer disposed between the first planarization layer and the second planarization layer, and the metal layer further protrudes than the first planarization layer.

6. The electroluminescent display device of claim 5, further comprising an inorganic film disposed between the metal layer and the second planarization layer and made of silicon nitride.

7. The electroluminescent display device of claim 6, wherein the inorganic film further protrudes than a bottom surface of the second planarization layer, and the etching-blocking layer further protrudes than the inorganic film.

8. The electroluminescent display device of claim 5, wherein the metal layer is disposed on a same layer and made of a same material as a connection electrode connected to the thin-film transistor.

9. The electroluminescent display device of claim 5, wherein the metal layer further protrudes than a bottom surface of the second planarization layer, and the etching-blocking layer further protrudes than the metal layer.

10. The electroluminescent display device of claim 1, wherein the second anti-connection part comprises:
at least one anti-connection hole; and
a first inorganic insulating film, a second inorganic insulating film disposed on the first inorganic insulating film, and a third inorganic insulating film disposed on the second inorganic insulating film, and
wherein the first inorganic insulating film, the second inorganic insulating film, and the third inorganic insulating film are disposed around the anti-connection hole and made of different materials.

11. The electroluminescent display device of claim 10, wherein the anti-connection hole exposes a surface of the substrate, and a light-emitting part of the light-emitting element is disposed on the exposed surface of the substrate so as to be disconnected from a periphery.

12. The electroluminescent display device of claim 10, wherein the first inorganic insulating film, the second inorganic insulating film, and the third inorganic insulating film are partially removed by the anti-connection hole.

13. The electroluminescent display device of claim 10, wherein side surfaces of the first inorganic insulating film and the third inorganic insulating film exposed through the anti-connection hole further protrude than a side surface of the second inorganic insulating film.

14. The electroluminescent display device of claim 10, wherein the first inorganic insulating film and the third inorganic insulating film are made of silicon nitride (SiNx), and the second inorganic insulating film is made of silicon oxide (SiOx).

15. The electroluminescent display device of claim 14, wherein the first inorganic insulating film comprises a first buffer layer, and the third inorganic insulating film comprises a second interlayer insulating layer.

16. The electroluminescent display device of claim 15, wherein the second inorganic insulating film comprises:
a second buffer layer disposed on the first buffer layer;
a gate insulating layer disposed on the second buffer layer; and
a first interlayer insulating layer disposed on the gate insulating layer, and
wherein side surfaces of the first buffer layer, the second buffer layer, the gate insulating layer, and the first interlayer insulating layer exposed through the anti-connection hole each have a concave-convex surface.

17. The electroluminescent display device of claim 16, further comprising a metal tip disposed on the third inorganic insulating film,
wherein a side surface of the metal tip further protrudes than a side surface of the second inorganic insulating film.

18. The electroluminescent display device of claim 1, wherein the thin-film transistor comprises a semiconductor layer, a gate electrode, a source electrode, and a drain electrode, and the semiconductor layer is made of an oxide semiconductor.

19. The electroluminescent display device of claim 1, wherein the through-hole comprises a first through-hole and a second through-hole disposed adjacent to the first through-hole, and wherein the second anti-connection part is configured to surround the first through-hole and the first anti-connection part is configured to surround the second anti-connection part; and wherein the at least one anti-connection part further comprises a fourth anti-connection part configured to surround the second through-hole and a third anti-connection part configured to surround the fourth anti-connection part, wherein the planarization layer of each of the first anti-connection part and the third anti-connection part has the undercut shape, and wherein the plurality of insulating layers of each of the second anti-connection part and the fourth anti-connection part each has the undercut shape.

20. The electroluminescent display device of claim 19, wherein the first anti-connection part and the third anti-connection part are in contact with each other on at least one point.

21. The electroluminescent display device of claim 19, wherein the first anti-connection part and the third anti-connection part each comprise:

a first planarization layer;

a second planarization layer disposed on the first planarization layer;

an etching-blocking layer disposed on the second planarization layer; and a light-emitting part of the light-emitting element disposed on the etching-blocking layer.

22. The electroluminescent display device of claim 21, wherein each of the first anti-connection part and the third anti-connection part comprises a metal layer disposed between the first planarization layer and the second planarization layer, and the metal layer further protrudes than the first planarization layer.

23. The electroluminescent display device of claim 22, further comprising an inorganic film disposed between the metal layer and the second planarization layer and made of silicon nitride.

24. The electroluminescent display device of claim 19, wherein each of the second anti-connection part and the fourth anti-connection part comprises:

at least one anti-connection hole; and a first inorganic insulating film, a second inorganic insulating film disposed on the first inorganic insulating film, and a third inorganic insulating film disposed on the second inorganic insulating film, and wherein the first inorganic insulating film, the second inorganic insulating film, and the third inorganic insulating film are disposed around the anti-connection hole and made of different materials.

25. The electroluminescent display device of claim 24, wherein side surfaces of the first inorganic insulating film and the third inorganic insulating film exposed through the anti-connection hole further protrude than a side surface of the second inorganic insulating film.

26. The electroluminescent display device of claim 24, further comprising a metal tip disposed on the third inorganic insulating film, wherein a side surface of the metal tip further protrudes than a side surface of the second inorganic insulating film.

* * * * *